US011282853B2

(12) United States Patent
Sotome et al.

(10) Patent No.: US 11,282,853 B2
(45) Date of Patent: Mar. 22, 2022

(54) SEMICONDUCTOR MEMORY DEVICE

(71) Applicant: KIOXIA CORPORATION, Minato-ku (JP)

(72) Inventors: Shinichi Sotome, Yokkaichi (JP); Tatsufumi Hamada, Nagoya (JP); Yasuhiro Uchimura, Yokkaichi (JP); Tomohiro Kuki, Yokkaichi (JP)

(73) Assignee: KIOXIA CORPORATION, Minato-ku (JP)

( * ) Notice: Subject to any disclaimer, the term of this patent is extended or adjusted under 35 U.S.C. 154(b) by 0 days.

(21) Appl. No.: 16/560,043

(22) Filed: Sep. 4, 2019

(65) Prior Publication Data

US 2020/0295036 A1    Sep. 17, 2020

(30) Foreign Application Priority Data

Mar. 15, 2019   (JP) .............................. JP2019-049082

(51) Int. Cl.
*H01L 27/115* (2017.01)
*H01L 27/11582* (2017.01)
(Continued)

(52) U.S. Cl.
CPC ...... *H01L 27/11582* (2013.01); *H01L 23/481* (2013.01); *H01L 27/1157* (2013.01)

(58) Field of Classification Search
CPC .......... H01L 27/11582; H01L 27/1157; H01L 23/481; H01L 2924/1434; H01L 2924/143; H01L 21/8229; H01L 27/222; H01L 27/24; H01L 29/685; H01L 29/792; H01L 29/8615; H01L 45/04; H01L 2027/11838; H01L 45/1233; H01L 45/1608; H01L 45/08; H01L 27/115; H01L 29/7926; H01L 29/66833; H01L 23/5226; H01L 29/40117; H01L 27/0688; H01L 29/7827; H01L 23/528; H01L 23/5283; H01L 29/1037;
(Continued)

(56) References Cited

U.S. PATENT DOCUMENTS 8,981,458 B2    3/2015 Lee et al.
9,070,589 B2    6/2015 Kawai et al.
(Continued)

FOREIGN PATENT DOCUMENTS

| JP | 2014-175348 A | 9/2014 |
|----|----|----|
| TW | 201816938 A | 5/2018 |
| TW | 201909386 A | 3/2019 |

*Primary Examiner* — Samuel Park
(74) *Attorney, Agent, or Firm* — Oblon, McClelland, Maier & Neustadt, L.L.P.

(57) ABSTRACT

According to one embodiment, a semiconductor memory device includes a base layer, conductive layers, an insulation layer, a semiconductor layer and a charge storage layer. The conductive layers are stacked above the base layer in a first direction. The insulation layer is extending in the conductive layers in the first direction. The semiconductor layer is arranged between the insulation layer and the conductive layers. The charge storage layer is arranged between the semiconductor layer and the conductive layers. The insulation layer includes a first insulation layer arranged on a side of the base layer and containing polysilazane and a second insulation layer arranged on the first insulation layer on a side opposite from the base layer.

18 Claims, 24 Drawing Sheets

(51) Int. Cl.
*H01L 27/1157* (2017.01)
*H01L 23/48* (2006.01)

(58) Field of Classification Search
CPC ....... H01L 21/8239; H01L 2924/13089; H01L 2924/14
See application file for complete search history.

(56) References Cited

U.S. PATENT DOCUMENTS

| | | |
|---|---|---|
| 9,450,023 B1 * | 9/2016 | Konevecki .......... H01L 27/2454 |
| 9,960,179 B2 | 5/2018 | Yamada |
| 2009/0146206 A1 * | 6/2009 | Fukuzumi ......... H01L 27/11556 257/324 |
| 2009/0267128 A1 | 10/2009 | Maejima |
| 2009/0268522 A1 | 10/2009 | Maejima |
| 2009/0321813 A1 * | 12/2009 | Kidoh ................ H01L 27/11582 257/324 |
| 2010/0207195 A1 | 8/2010 | Fukuzumi et al. |
| 2011/0284946 A1 | 11/2011 | Kiyotoshi |
| 2015/0221667 A1 | 8/2015 | Fukuzumi et al. |
| 2017/0062459 A1 | 3/2017 | Yoshimizu et al. |
| 2017/0263635 A1 * | 9/2017 | Hamada ............ H01L 27/11582 |
| 2019/0363100 A1 * | 11/2019 | Lee ....................... H01L 23/528 |

* cited by examiner

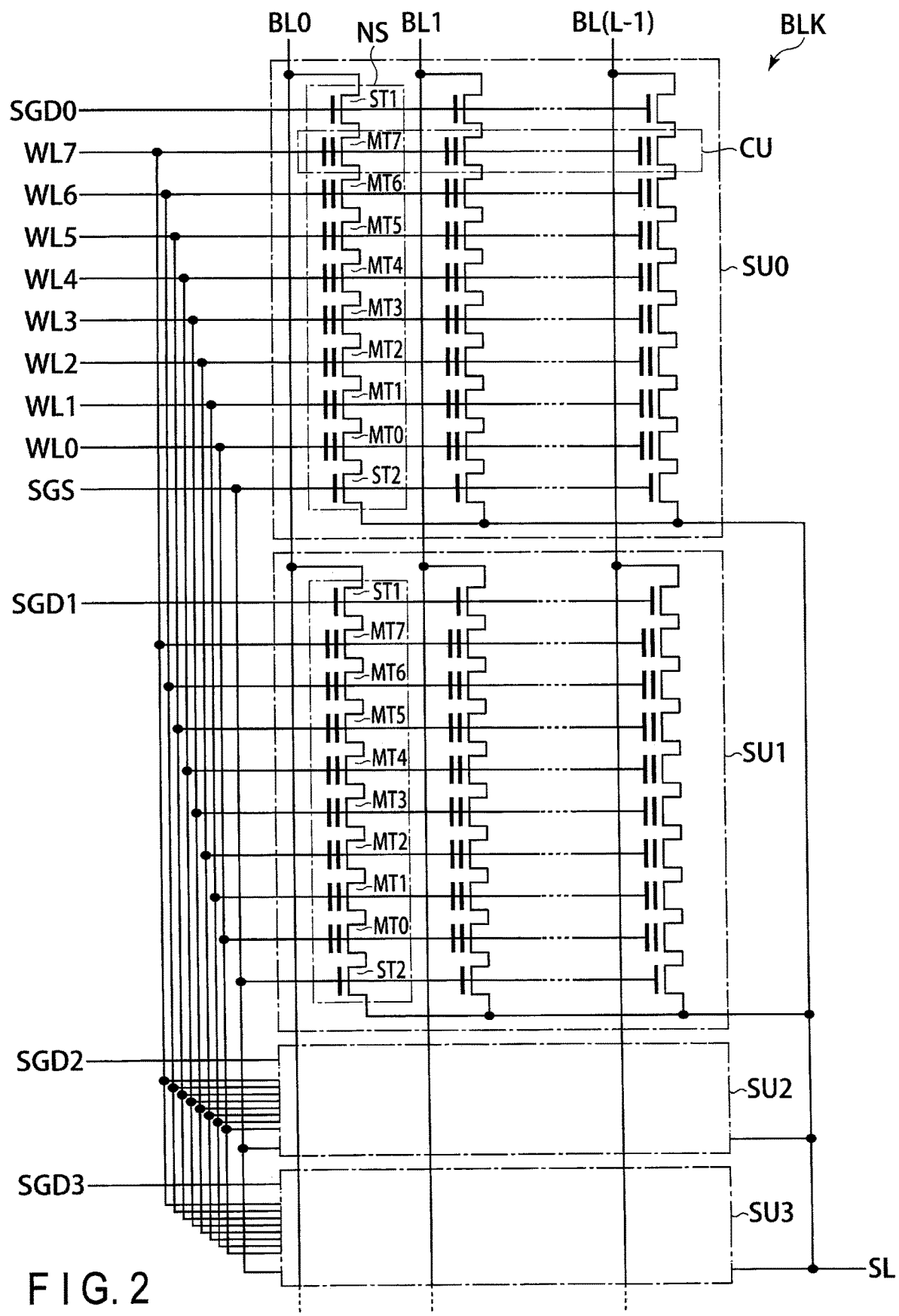
F I G. 2

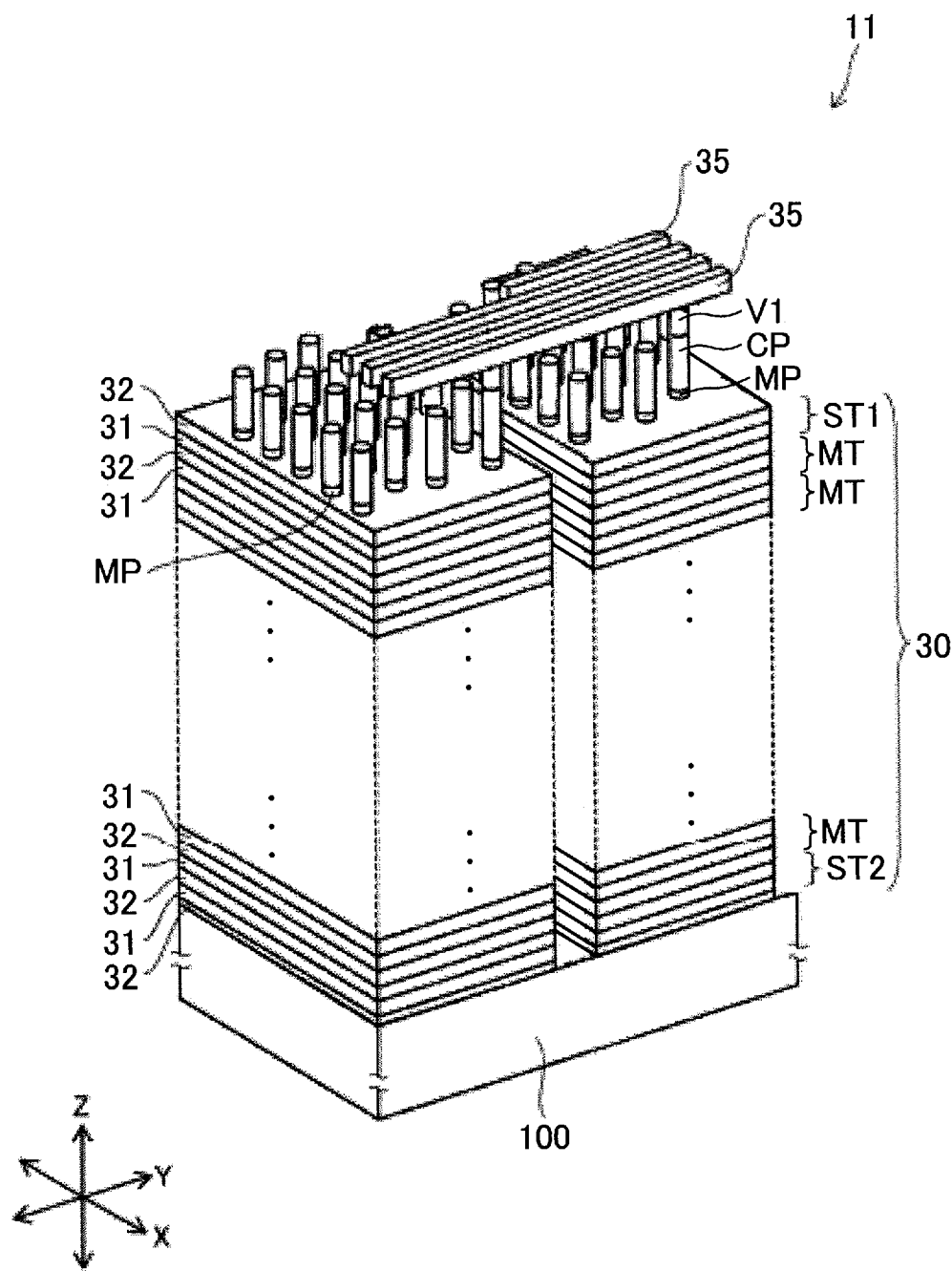
F I G. 3

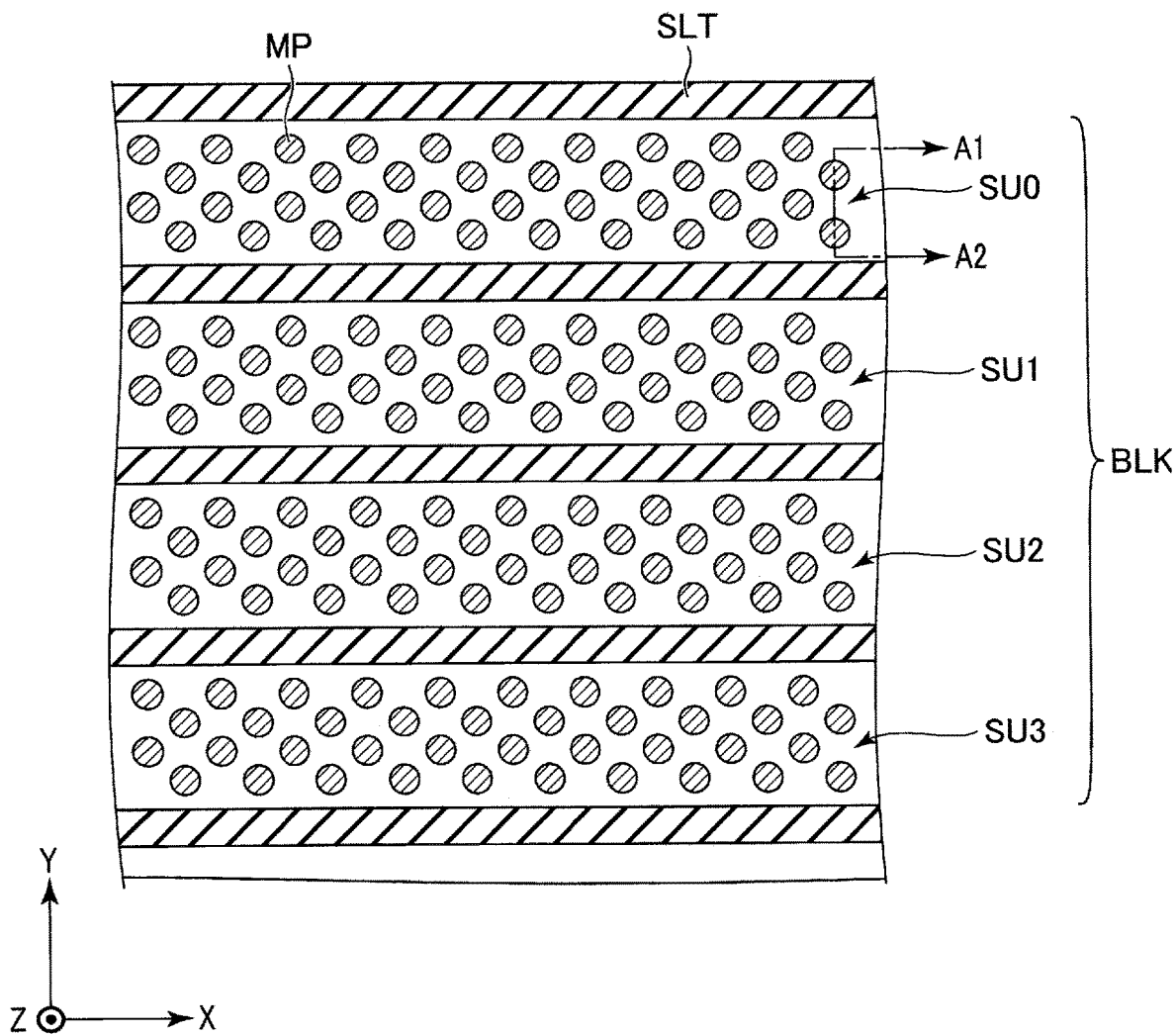
F I G. 4

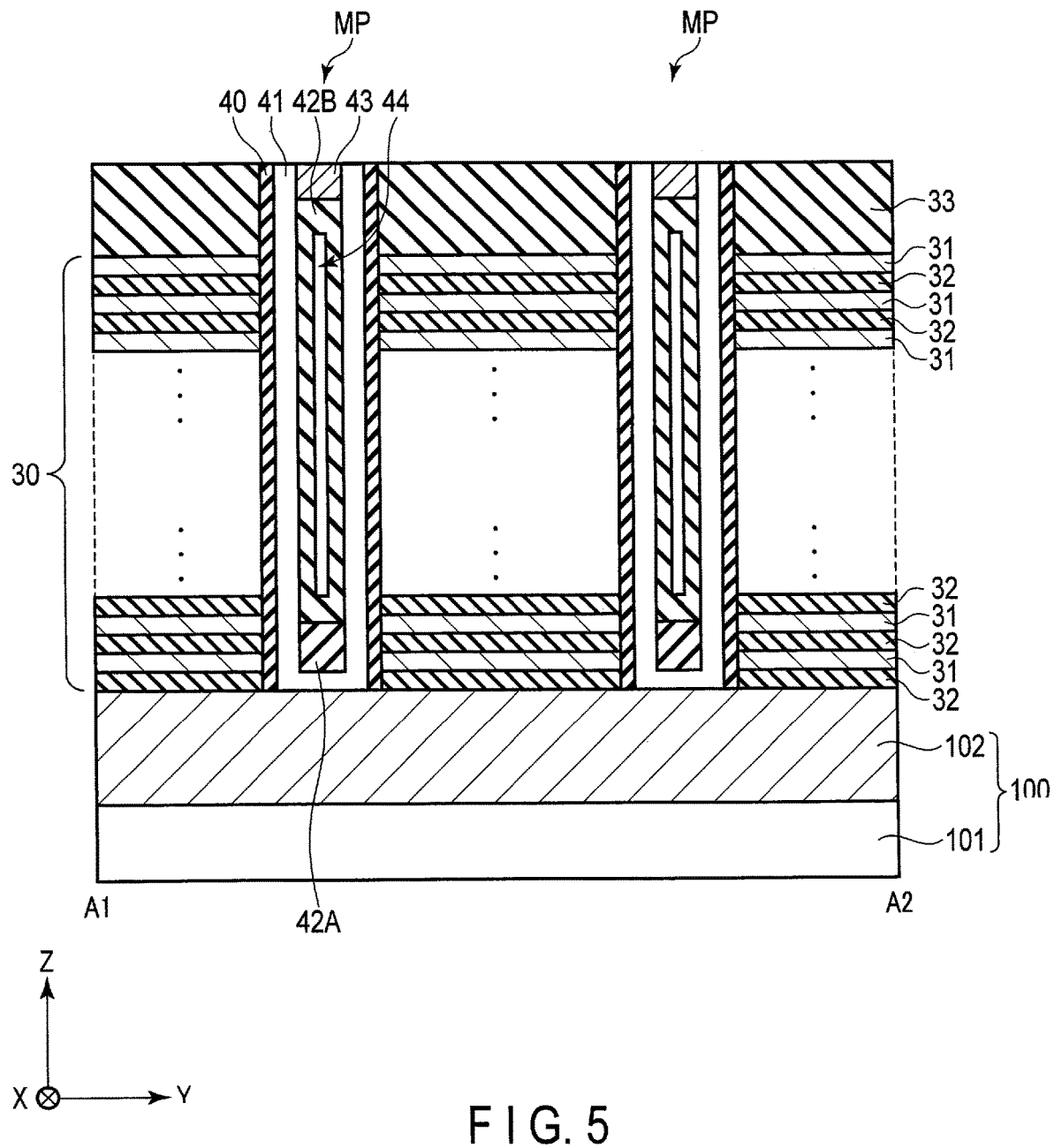
F I G. 5

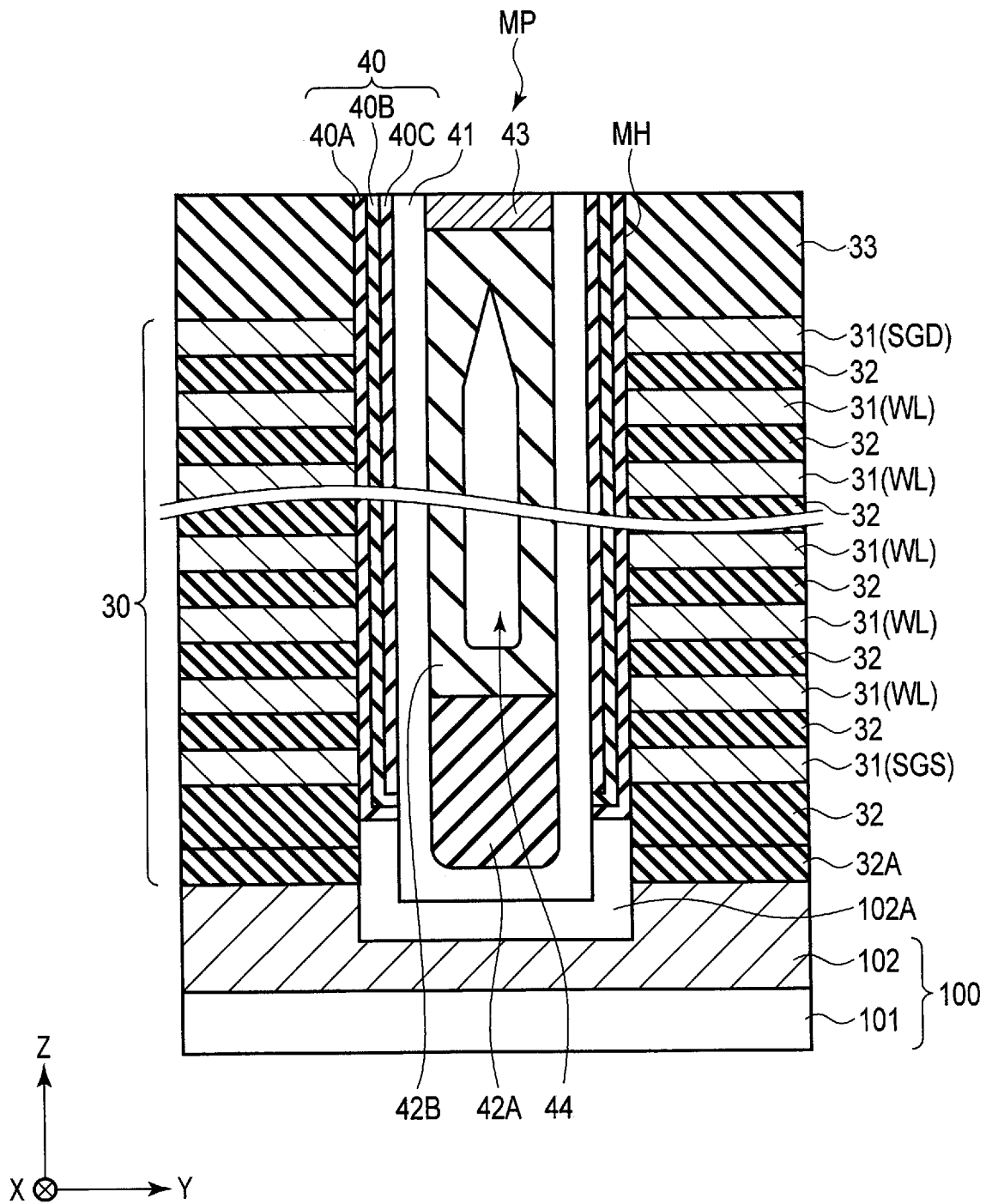
F I G. 6

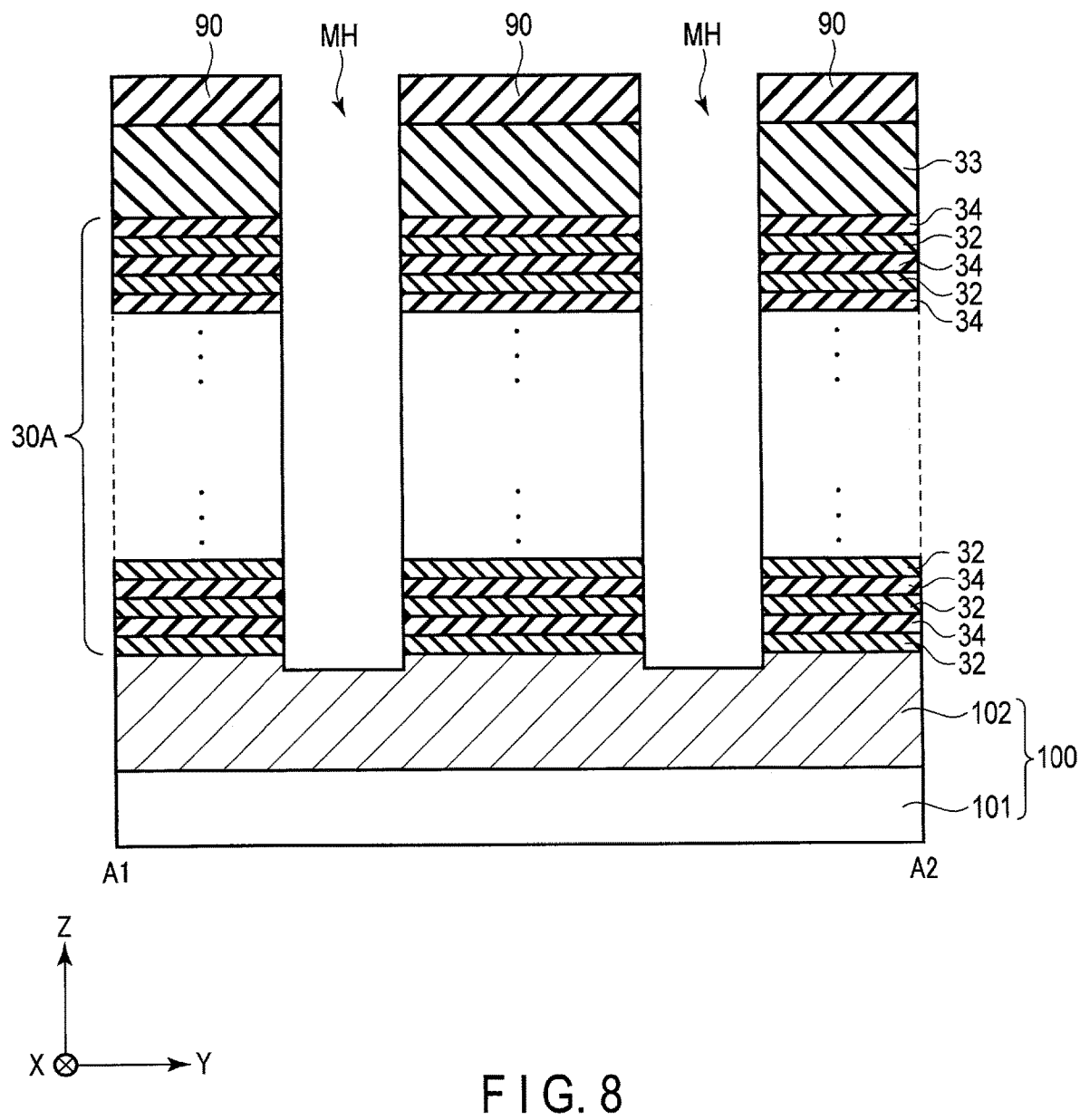
F I G. 8

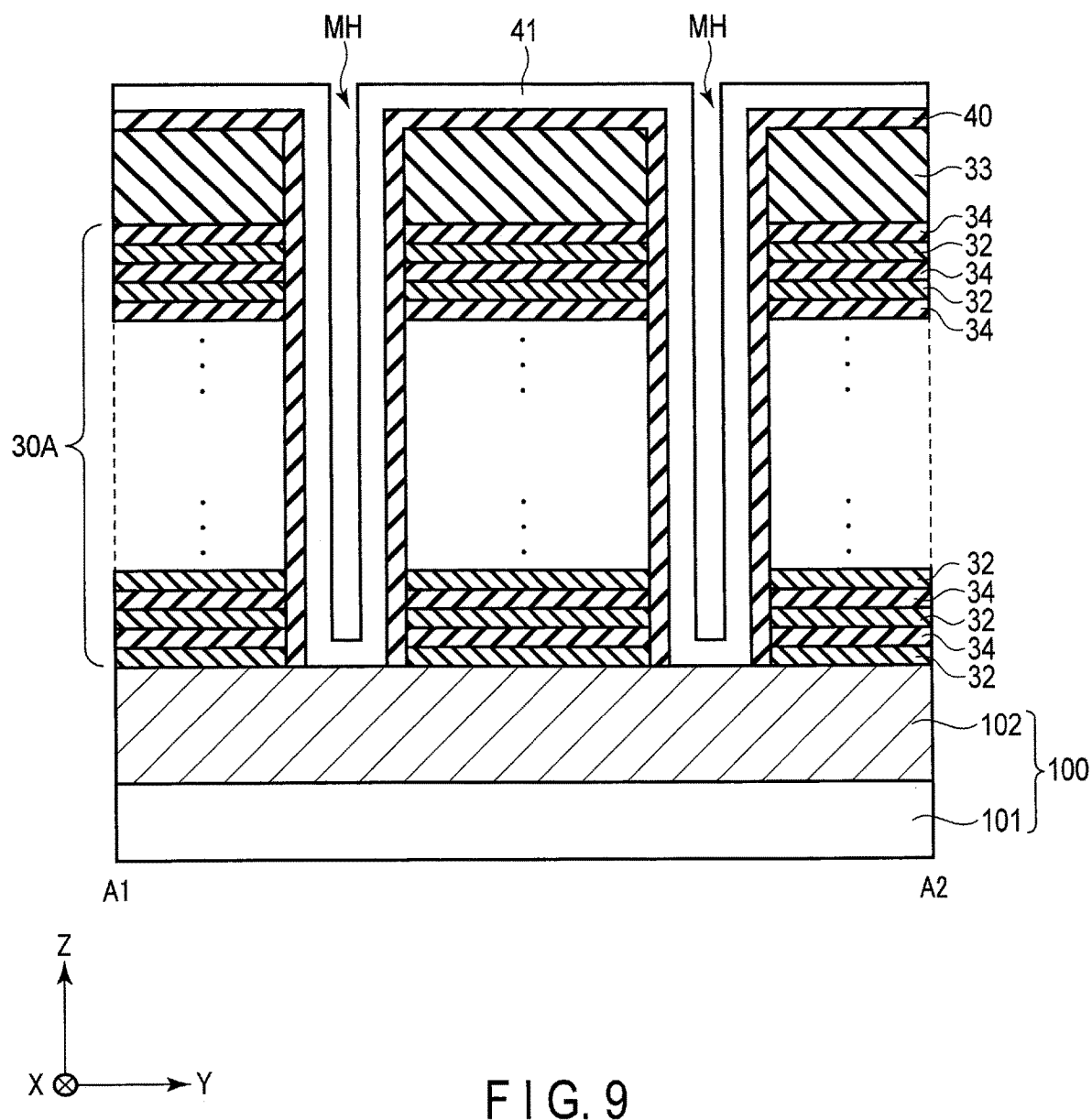
F I G. 9

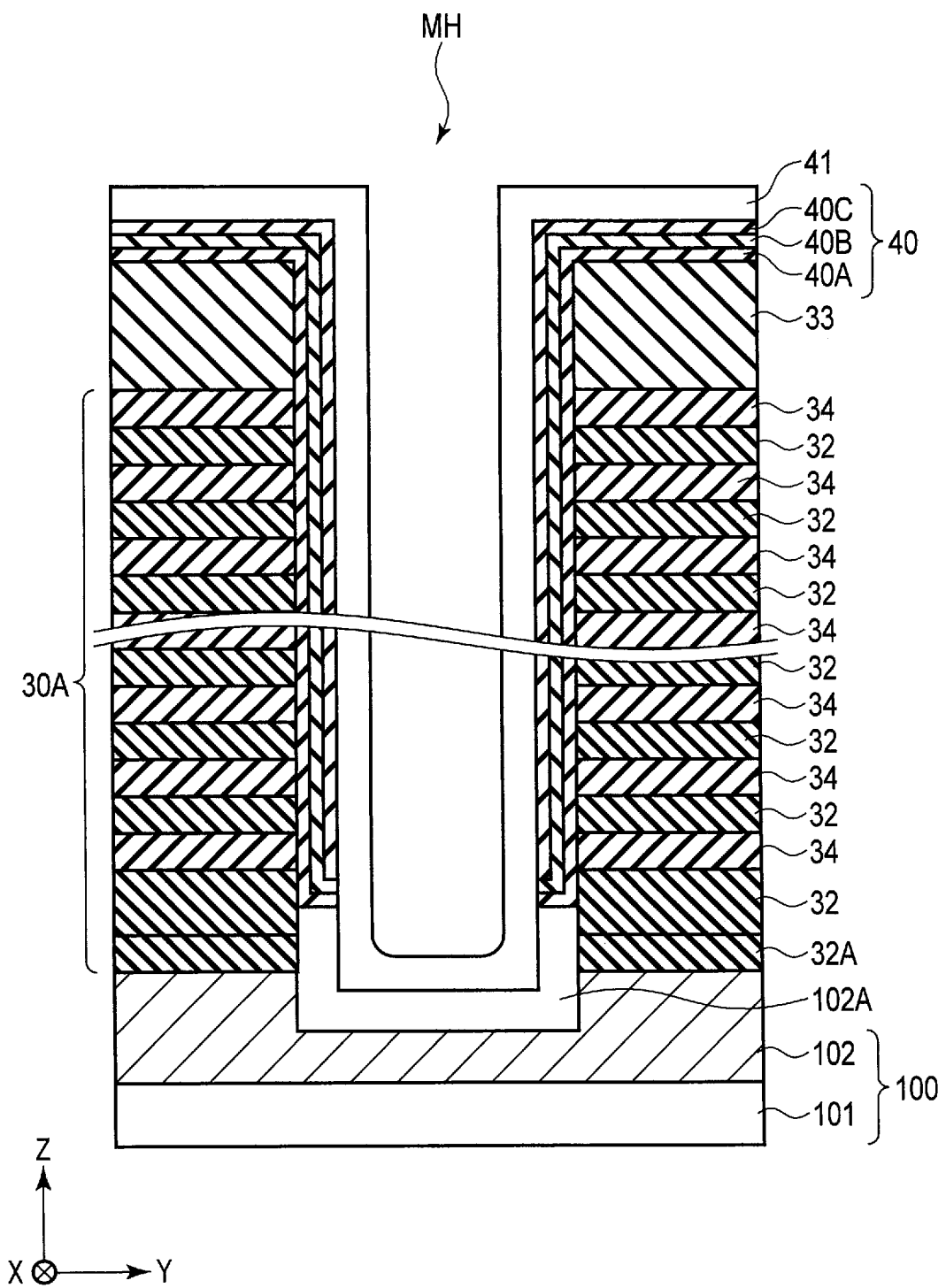
F I G. 10

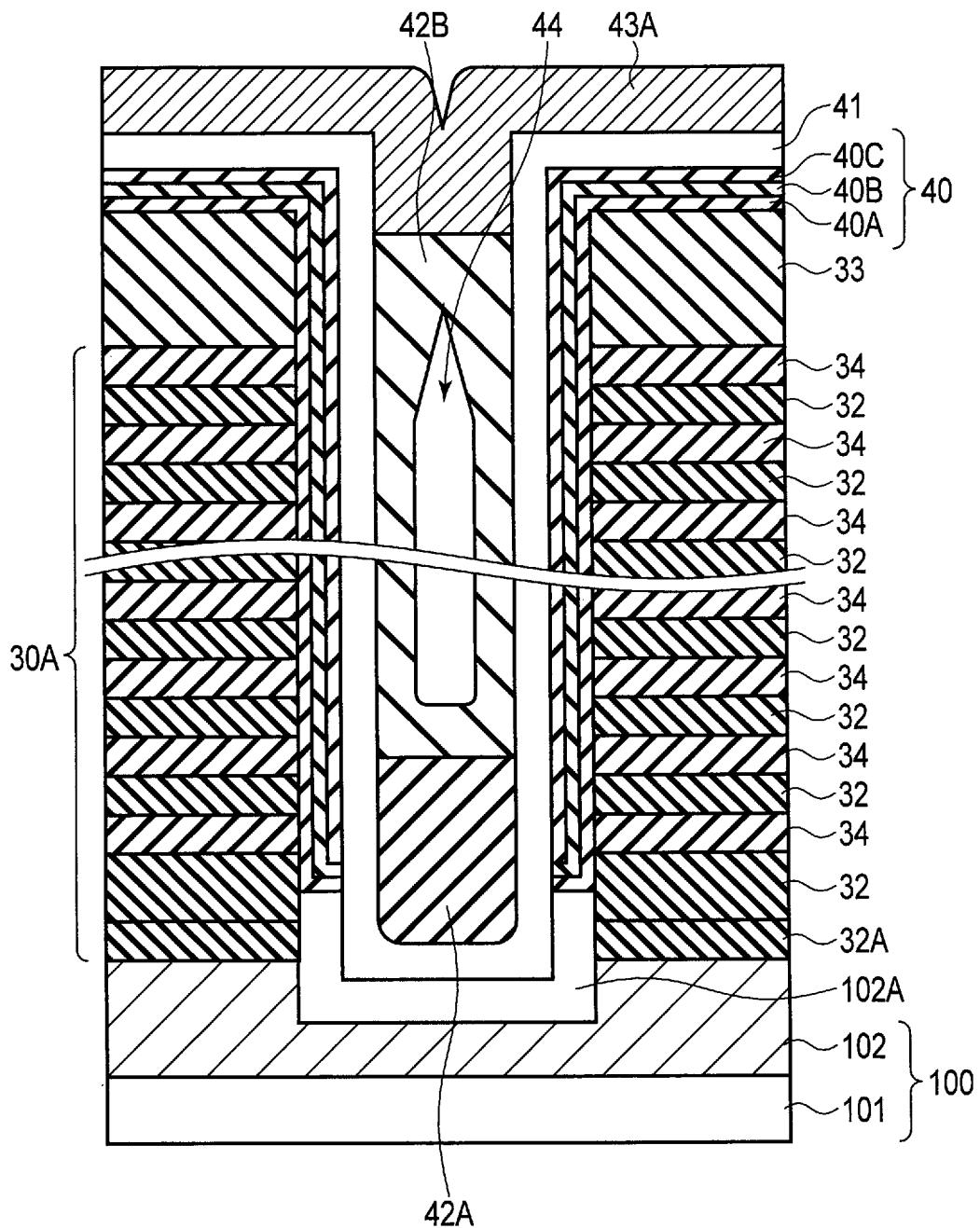
F I G. 14

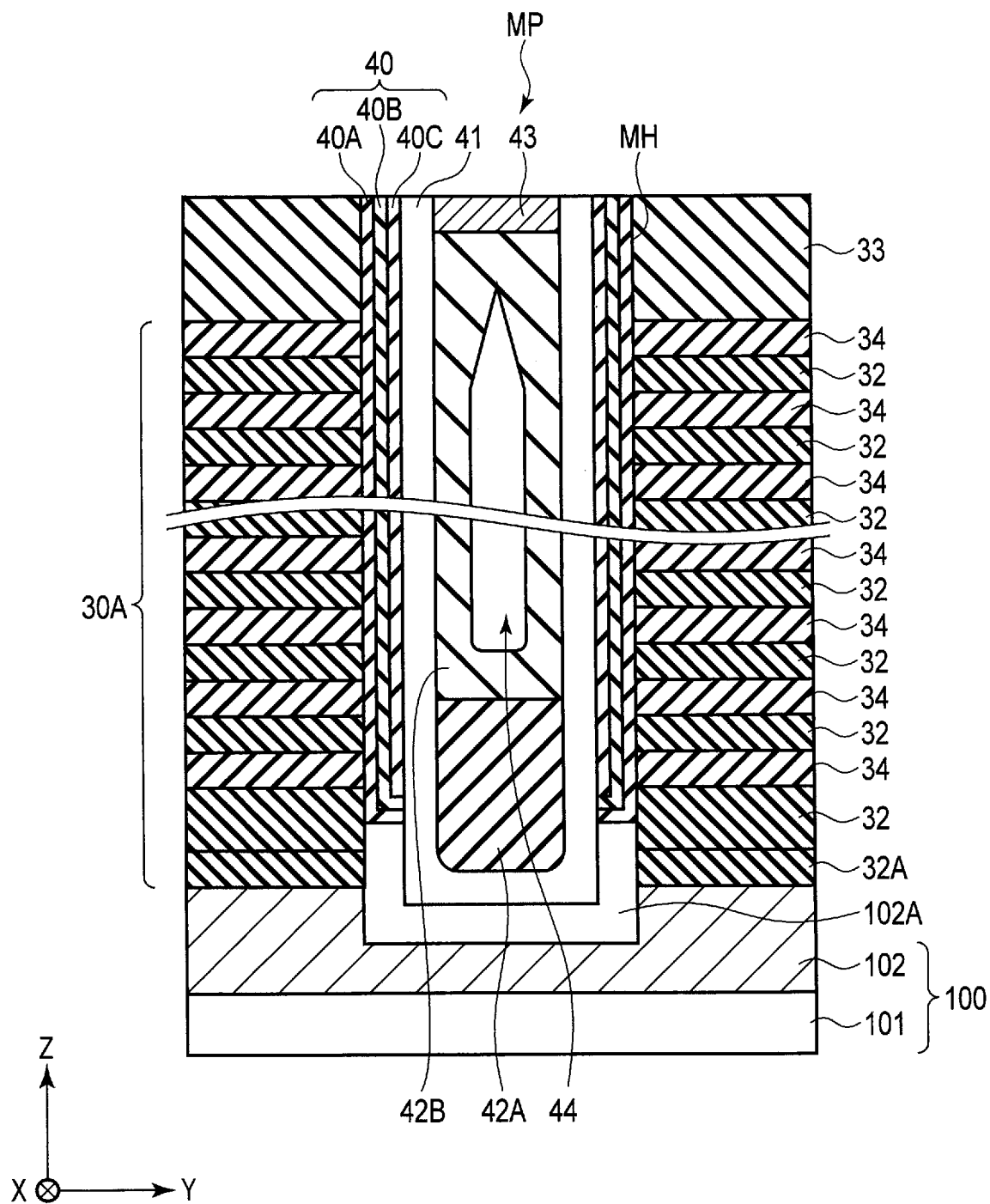
F I G. 15

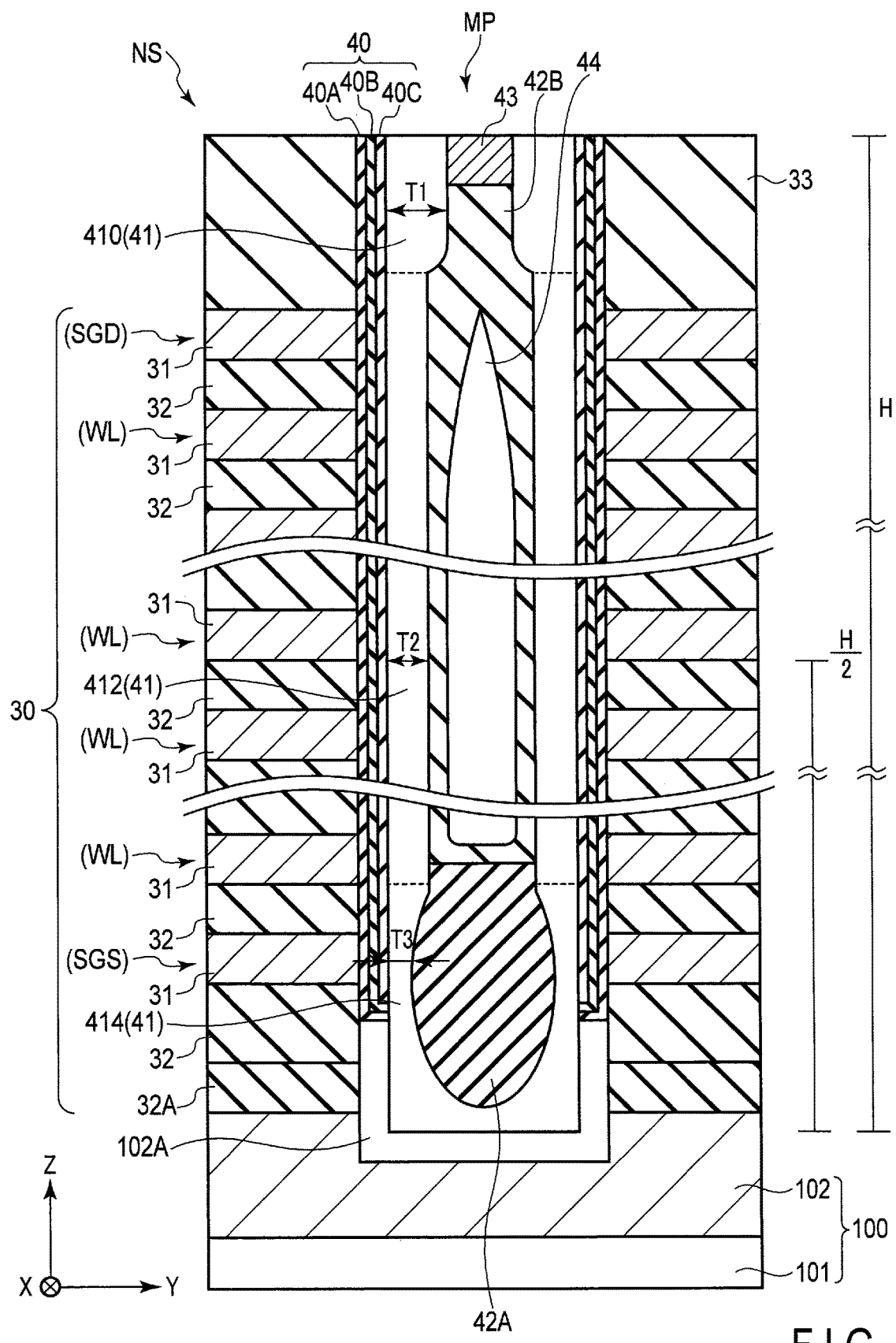
F I G. 16

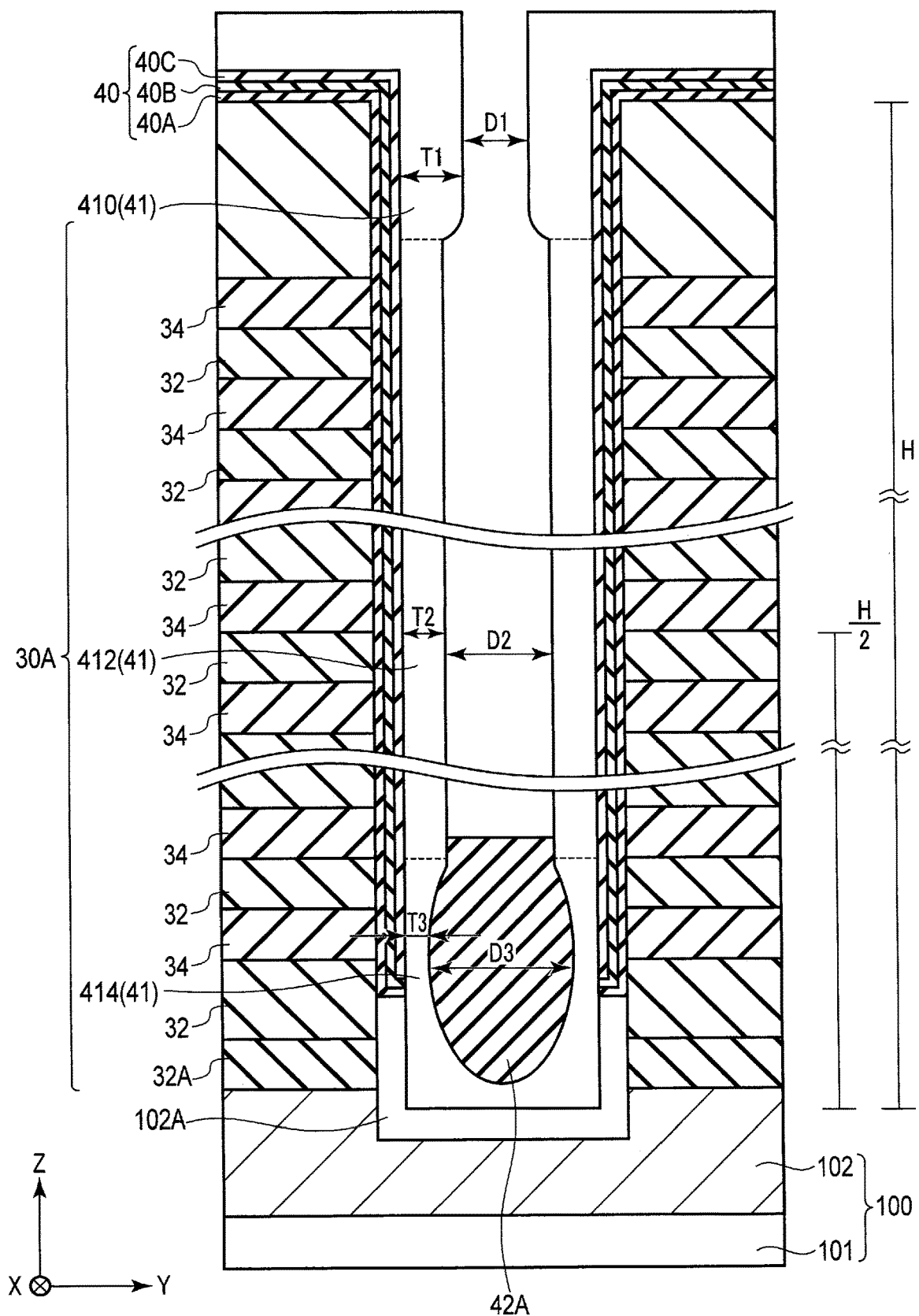
F I G. 20

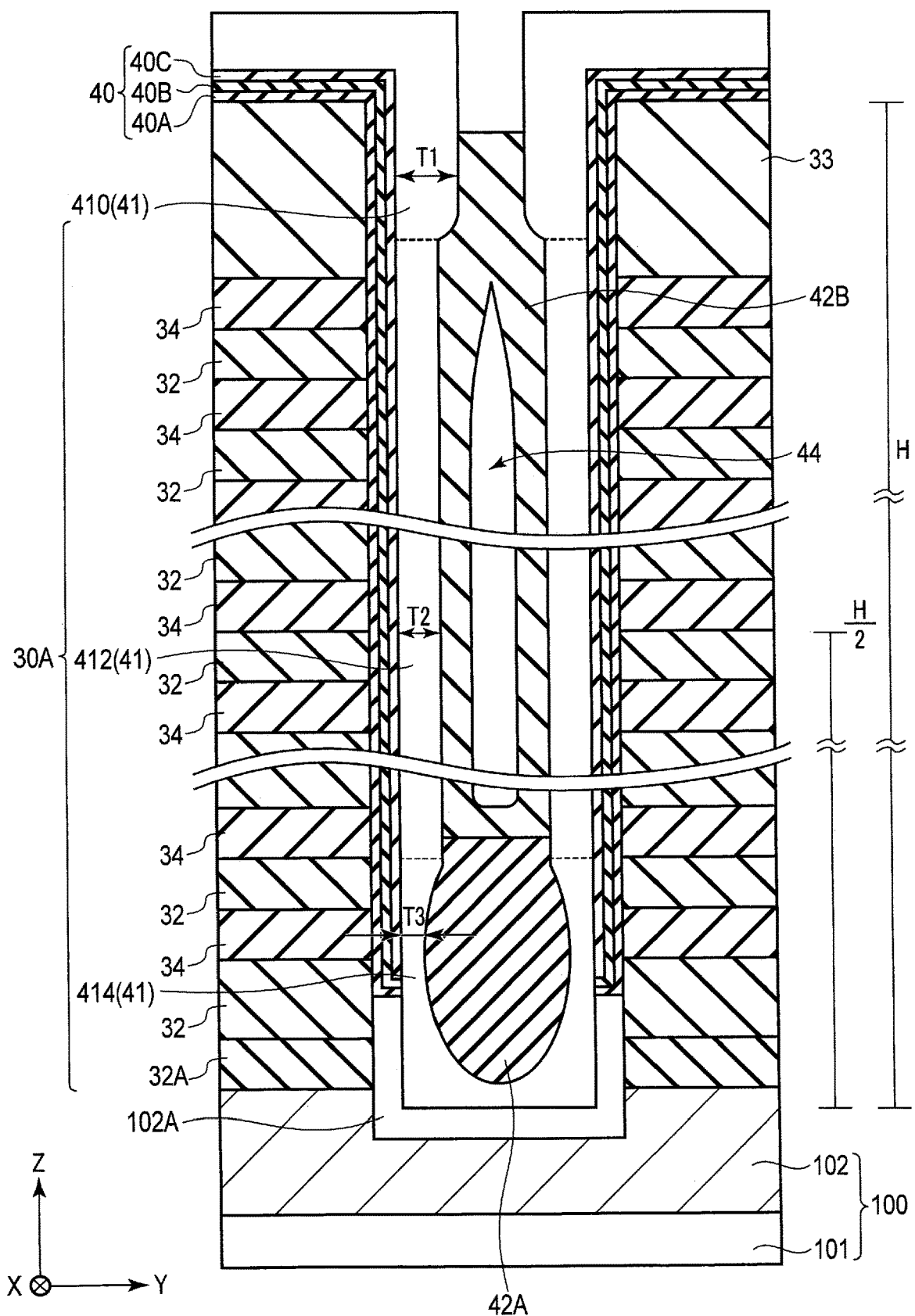
F I G. 22

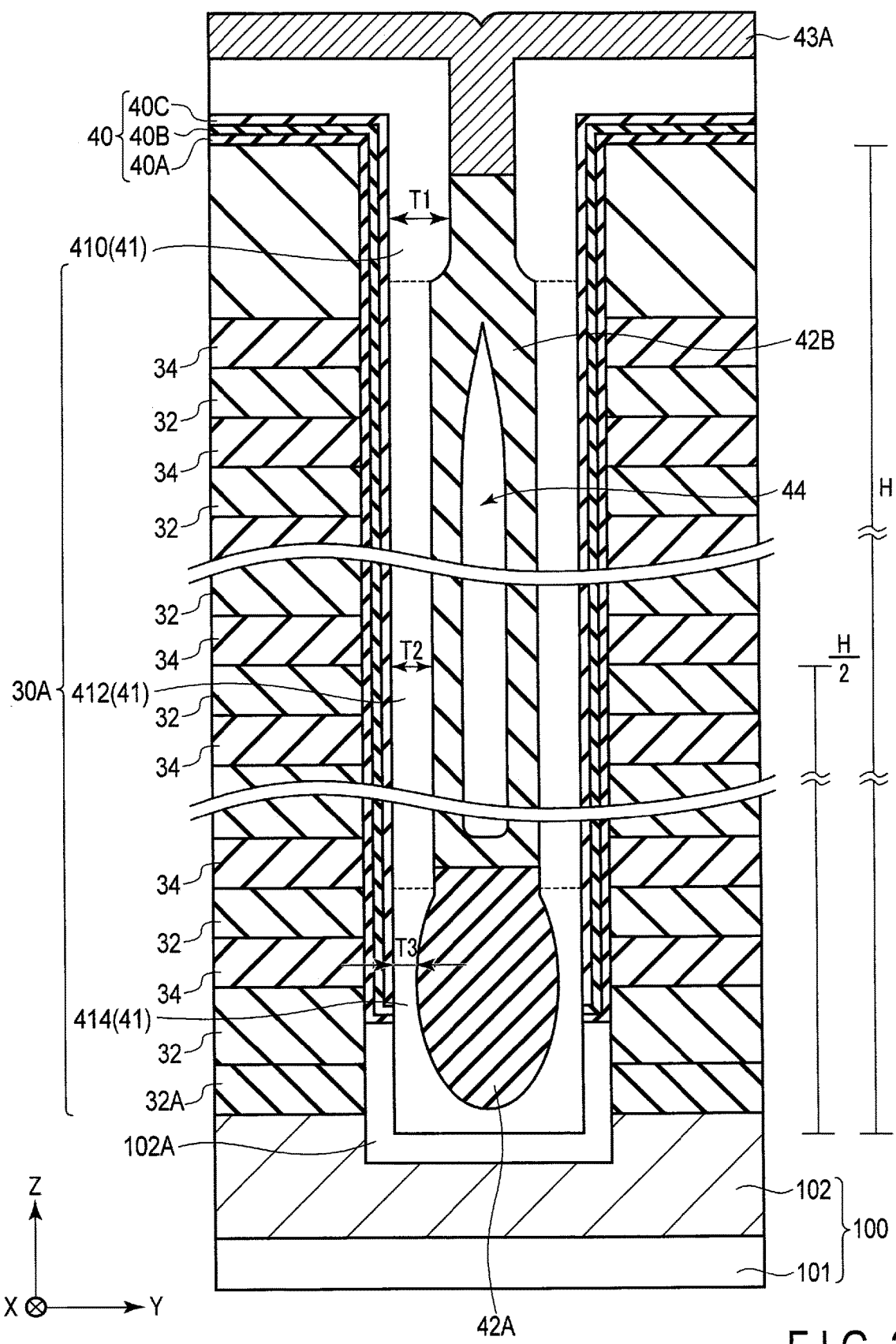
F I G. 23

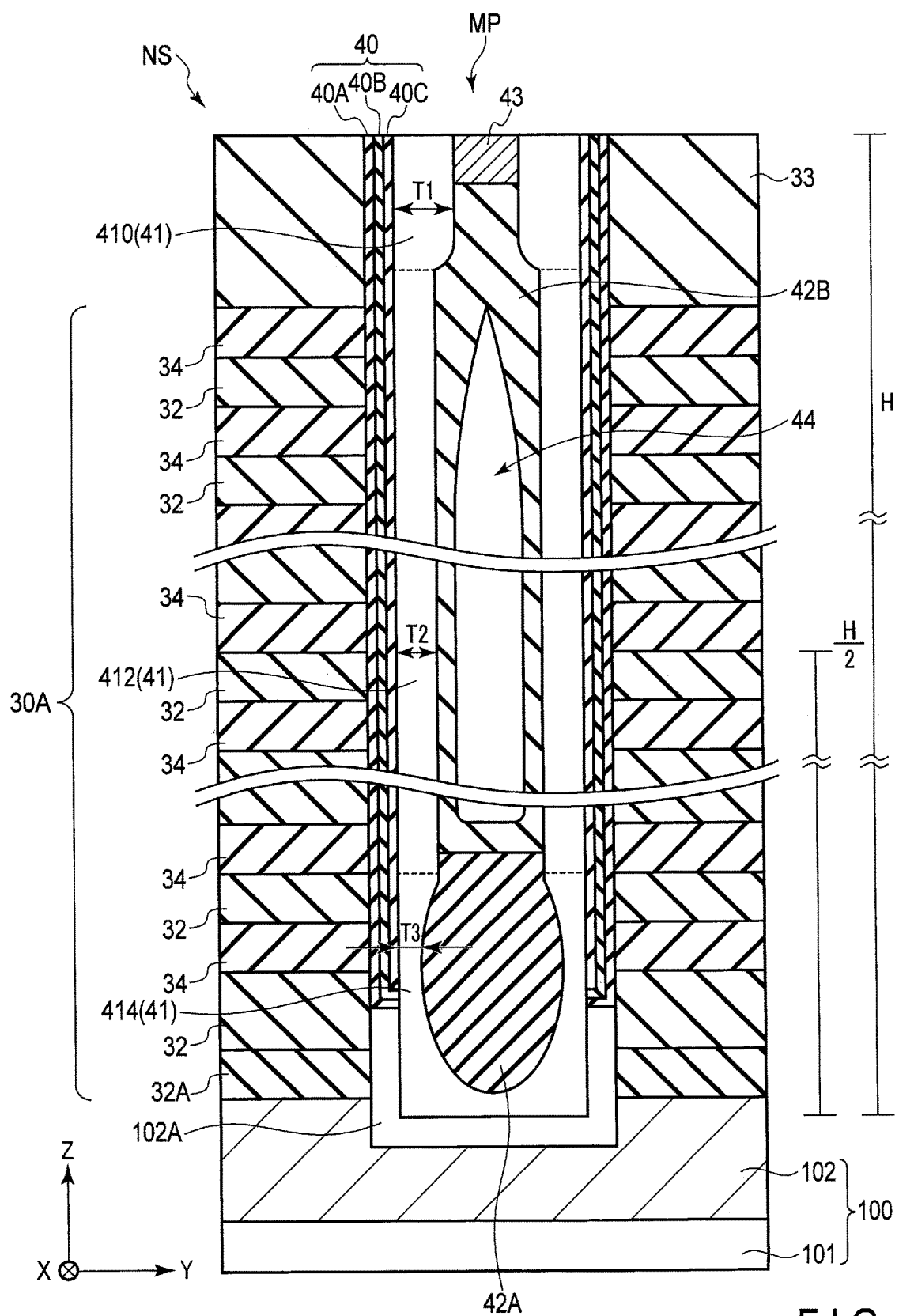
F I G. 24

SEMICONDUCTOR MEMORY DEVICE

CROSS-REFERENCE TO RELATED APPLICATIONS

This application is based upon and claims the benefit of priority from the Japanese Patent Application No. 2019-049082, filed Mar. 15, 2019, the entire contents of which are incorporated herein by reference.

FIELD

Embodiments described herein relate generally to a semiconductor memory device.

BACKGROUND

A semiconductor memory device in which memory cells are three-dimensionally arranged is known.

BRIEF DESCRIPTION OF THE DRAWING

FIG. 2 is a circuit diagram corresponding to the block of the semiconductor memory device according to the first embodiment.

FIG. 3 is a perspective view schematically showing a memory cell array of the semiconductor memory device according to the first embodiment.

FIG. 4 is a plan view showing, from the above, a layout of the memory cell array of the semiconductor memory device according to the first embodiment.

FIG. 5 is a cross-sectional view taken along line A1-A2 shown in FIG. 4.

FIG. 6 is a cross-sectional view of a memory pillar of the semiconductor memory device according to the first embodiment.

FIGS. 7, 8 and 9 are cross-sectional views of a structure in a manufacturing step of the semiconductor memory device, taken along line A1-A2, according to the first embodiment.

FIGS. 10 to 15 are cross-sectional views of a memory pillar forming area in a manufacturing step of the semiconductor memory device according to the first embodiment.

FIG. 16 is a cross-sectional view of a memory pillar of a semiconductor memory device according to a second embodiment.

FIGS. 18 to 24 are cross-sectional views of a memory pillar forming area in a manufacturing step of the semiconductor memory device according to the second embodiment.

DETAILED DESCRIPTION

In general, according to one embodiment, a semiconductor memory device includes a base layer, a plurality of conductive layers, an insulation layer, a semiconductor layer and a charge storage layer. The conductive layers are stacked above the base layer in a first direction. The insulation layer is extending in the conductive layers in the first direction. The semiconductor layer is arranged between the insulation layer and the conductive layers. The charge storage layer is arranged between the semiconductor layer and the conductive layers. The insulation layer includes a first insulation layer arranged on a side of the base layer and containing polysilazane and a second insulation layer arranged on the first insulation layer on a side opposite from the base layer.

Hereinafter, embodiments will be described with reference to the drawings. In the description below, structural elements having the same functions and configurations will be denoted by the same reference symbols. Each of the embodiments described below merely shows an exemplary device and method for implementing the technical idea of the embodiment. The component materials, shapes, structures, arrangements, etc., are not limited to those described below.

Each of the function blocks can be implemented in the form of hardware, computer software, or a combination thereof. The function blocks do not have to be distinguished from each other as in the example described below. For example, part of the functions may be implemented by a function block other than the exemplary function blocks. In addition, the exemplary function blocks may be further divided into function sub-blocks. As an example of a nonvolatile semiconductor memory device, a three-dimensionally stacked NAND flash memory in which memory cell transistors are stacked above a semiconductor substrate will be described.

1. First Embodiment

A semiconductor memory device according to a first embodiment will be described below.

1.1 Circuit Block Configuration of Semiconductor Memory Device

Figure 1:
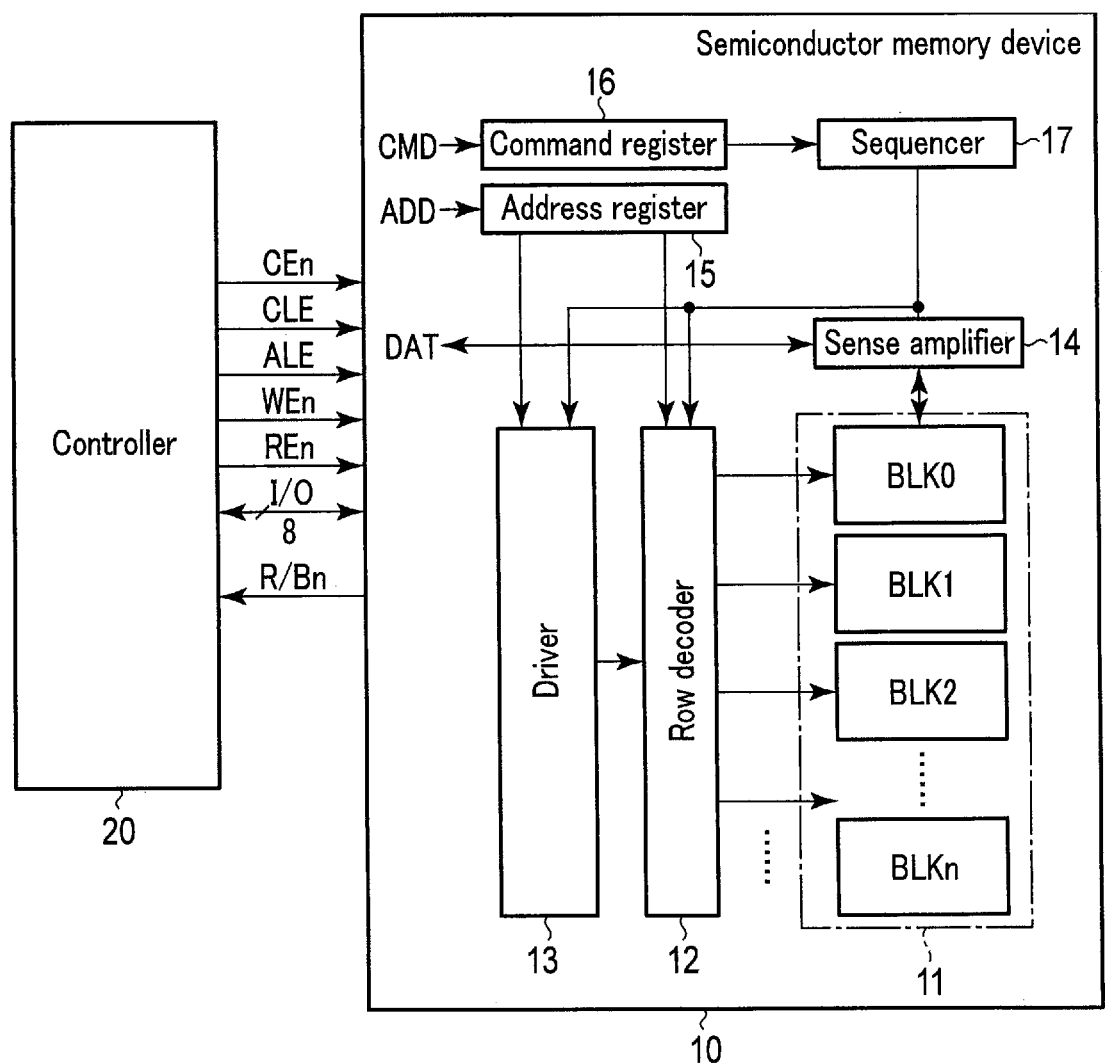
FIG. 1 is a block diagram of the semiconductor memory device according to the first embodiment.

First, with reference to FIG. 1, a circuit block configuration of the semiconductor memory device according to the first embodiment will be described. FIG. 1 is a block diagram showing a circuit configuration of the semiconductor memory device according to the first embodiment. A semiconductor memory device 10 includes a memory cell array 11, a row decoder 12, a driver 13, a sense amplifier 14, an address register 15, a command register 16, and a sequencer 17. For example, an external controller 20 is connected to the semiconductor memory device 10 via an NAND bus. The controller 20 accesses the semiconductor memory device 10 to control the semiconductor memory device 10.

1.1.1 Configuration of Blocks

The memory cell array 11 has a plurality of blocks BLK0, BLK1, BLK2, . . . , BLKn (n is an integer of 0 or more) each including a plurality of nonvolatile memory cells associated with rows and columns. Hereinafter, the "block BLK" may indicate each of the blocks BLK0 to BLKn or a specific block BLK, for convenience. The memory cell array 11 stores data provided from the controller 20. Details of the memory cell array 11 and the block BLK will be described later.

The row decoder 12 selects one block BLK, and selects a word line in the selected block BLK. Details of the row decoder 12 will be explained later.

The driver 13 supplies a voltage to the selected block BLK via the row decoder 12.

When reading data, the sense amplifier 14 senses data DAT read from the memory cell array 11, and carries out necessary calculations. Then, this data DAT is output to the controller 20. When writing data, the sense amplifier 14 transfers write data DAT received from the controller 20 to the memory cell array 11.

The address register 15 stores an address ADD received from the controller 20. The address ADD includes a block address designating a block BLK as an operation target, and a page address indicating a word line as an operation target in the designated block. The command register 16 stores a command CMD received from the controller 20. The command CMD includes a write command to command the sequencer 17 to carry out a write operation, and a read command to command the sequencer 17 to carry out a read operation, for example.

The sequencer 17 controls the operation of the semiconductor memory device 10 based on the command CMD stored in the command register 16. Specifically, the sequencer 17 controls the row decoder 12, the driver 13, and the sense amplifier 14 so as to write into a plurality of memory cell transistors designated by the address ADD, based on the write command stored in the command register 16. The sequencer 17 controls the row decoder 12, the driver 13, and the sense amplifier 14 so as to read from the plurality of memory cell transistors designated by the address ADD, based on the read command stored in the command register 16.

As described above, the controller 20 is connected to the semiconductor memory device 10 via the NAND bus. The NAND bus transmits and receives signals in accordance with the NAND interface. Specifically, the NAND bus includes a bus that communicates a chip enable signal CEn, a command latch enable signal CLE, an address latch enable signal ALE, a write enable signal WEn, a read enable signal REn, an input/output signal I/O, and a ready/busy signal R/Bn, for example. The input/output signal I/O is transmitted with a bus width of 8 bits. An input/output signal I/O communicates a command CMD, an address ADD, and data DAT, etc.

1.1.2 Circuit Configuration of Memory Cell Array 11

As described above, the memory cell array 11 includes blocks BLK0 to BLKn. The blocks BLK0 to BLKn have the same configuration. The circuit configuration of one block BLK will be described below.

FIG. 2 is a circuit diagram of a block BLK included in the memory cell array 11. As shown in FIG. 2, the block BLK includes four string units SU0 to SU3, for example. A term, "string unit SU" hereinafter refers to each of the string units SU0 to SU3. A string unit SU includes a plurality of NAND strings NS.

Each of the NAND strings NS includes eight memory cell transistors MT0 to MT7 and select transistors ST1 and ST2, for example. A term, "memory cell transistor MT" hereinafter refers to each of the memory cell transistors MT0 to MT7. A memory cell transistor (which will also be referred to as a "memory cell") MT includes a control gate and a charge storage layer, and stores data in a nonvolatile manner. Memory cell transistors MT are coupled in series between the source of the select transistor ST1 and the drain of the select transistor ST2.

The gates of the select transistors ST1 in the string units SU0 to SU3 are respectively coupled to select gate lines SGD0 to SGD3. On the other hand, the gates of the select transistors ST2 in the string units SU0 to SU3 are coupled to one select gate line SGS, for example. The gates of the select transistors ST2 in different string units may be coupled to different select gate lines SGS0 to SGS3. The control gates of the memory cell transistors MT0 to MT7 in the string units SU0 to SU3 in the block BLK are respectively coupled to word lines WL0 to WL7.

In the memory cell array 11, the blocks BLK0 to BLKn share bit lines BL0 to BL (L−1). L is an integer of 2 or more.

In the string units SU0 to SU3 in the block BLK, each bit line BL is coupled in common to the drains of the select transistors ST1 of the NAND strings NS in the same row. In other words, each bit line BL couples in common the NAND strings NS of the string units SU0 to SU3 in the same column. Furthermore, the sources of the select transistors ST2 are coupled in common to a source line SL. In other words, a string unit SU includes NAND strings NS that are coupled to different bit lines BL and are coupled to the same select gate line SGD.

A block BLK includes the string units SU that share the word lines WL.

Memory cell transistors MT coupled to a common word line WL in a string unit SU are called a cell unit CU. The storage capacity of the cell unit CU changes in accordance with the number of bits of data stored in the memory cell transistors MT. For example, a cell unit CU stores one-page data, two-page data, or three-page data if each memory cell transistor MT stores 1-bit data, 2-bit data, or 3-bit data, respectively.

The configuration of the memory cell array 11 is not limited to the above-described configuration. For example, the number of string units SU included in each block BLK may be set to any number. The numbers of the memory cell transistors MT and the select transistors ST1 and ST2 that are included in each NAND string NS may be respectively set to any numbers.

The configuration of the memory cell array 11 is described in U.S. patent application Ser. No. 12/407,403 filed on Mar. 19, 2009 and titled "THREE DIMENSIONAL STACKED NONVOLATILE SEMICONDUCTOR MEMORY," for example. The configuration of the memory cell array 11 is also described in U.S. patent application Ser. No. 12/406,524 filed on Mar. 18, 2009 and titled "THREE DIMENSIONAL STACKED NONVOLATILE SEMICONDUCTOR MEMORY," U.S. patent application Ser. No. 12/679,991 filed on Mar. 25, 2010 and titled "NONVOLATILE SEMICONDUCTOR STORAGE DEVICE AND METHOD OF MANUFACTURING THE SAME," and U.S. patent application Ser. No. 12/532,030 filed on Mar. 23, 2009 and titled "SEMICONDUCTOR MEMORY AND METHOD FOR MANUFACTURING SAME." The entire contents of these applications are incorporated herein by reference.

1.2 Structure of Semiconductor Memory Device

Next, the structure of the semiconductor memory device according to the first embodiment will be described.

1.2.1 Layout Structure of Semiconductor Memory Device

FIG. 3 is a bird's-eye view showing a structure of a part of the memory cell array 11 in the semiconductor memory device 10 according to the first embodiment. In FIG. 3, two directions orthogonal to (or crossing) each other and parallel to the surface of a semiconductor substrate 100 are defined as an X direction and a Y direction, and a direction orthogonal to (or crossing) the X direction and the Y direction (XY plane) is defined as a Z direction.

As shown in FIG. 3, the semiconductor memory device 10 includes a memory cell array 11 having a three-dimensional structure. The memory cell array 11 includes a stacked body (or a structure) 30 provided above the semiconductor substrate 100, a plurality of memory pillars MP, and a plurality of conductive layers (wires) 35.

Each stacked body 30 corresponds to one block BLK or one string unit SU. The stacked body 30 includes a select transistor ST2, a plurality of memory cell transistors MT, and a select transistor ST1.

Specifically, the stacked body 30 includes a plurality of conductive layers 31 and a plurality of insulation layers 32. The conductive layers 31 and the insulation layers 32 are alternately stacked above the semiconductor substrate 100 in the Z direction. The Z direction is approximately orthogonal to the surface of the substrate 100.

The plurality of memory pillars MP are arranged in a staggered manner on the XY plane in the Y direction, for example. Each memory pillar MP corresponds to a NAND string NS. The memory pillars MP may be arranged on the XY plane in a square-lattice manner.

The memory pillars MP are provided in the stacked body 30 to extend through the stacked body 30 in the Z direction. Each memory pillar MP has an approximately columnar structure.

The plurality of conductive layers 35 are provided above the stacked body 30. The conductive layers 35 function as bit lines BL. The bit lines BL are arranged in the X direction, and extend in the Y direction. The bit lines BL are metal layers, and include tungsten (W), for example.

The upper end of each memory pillar MP is coupled to a bit line BL via a contact plug CP and a via plug V1. A plurality of memory pillars MP are coupled to one common bit line BL. The plurality of memory pillars MP coupled to the common bit line BL are respectively selected from memory pillars MP in different stacked bodies 30, for example.

In the drawings referred to below, the X direction corresponds to the extending direction (longitudinal direction) of word lines WL, and the Y direction corresponds to the extending direction of the bit lines BL. In the cross-sectional views referred to below, structural elements such as an insulation layer (an interlayer insulation film), a wire, and a contact included in the semiconductor memory device according to the first embodiment are suitably omitted.

FIG. 4 is a diagram showing an example of a plane layout of the memory cell array 11 in the semiconductor memory device according to the first embodiment. FIG. 4 focuses on a configuration corresponding to any one of the plurality of blocks ELK arranged in the Y direction.

As shown in FIG. 4, a plurality of stacked bodies 30 are provided on the substrate, for example. The stacked bodies 30 respectively correspond to string units SU0 to SU3 of the block ELK. The stacked bodies 30 are arranged in the Y direction. Each of the stacked bodies 30 extend in the X direction.

The string units SU0 to SU3 are isolated from each other by slits SLT. The slits SLT extending in the X direction are provided between the string slits SU0 to SU3 adjacent to each other with respect to the Y direction. Two slits SLT extending in the X direction are adjacent to each other with respect to the Y direction.

In this example, a stacked body 30 between the two slits SLT adjacent to each other with respect to the Y direction corresponds to one string unit SU. A plurality of string units SU may be provided in each area surrounded by the slits SLT.

FIG. 4 schematically shows the memory pillars MP, and the number of the memory pillars MP is not limited to that shown in FIG. 4.

1.2.2 Cross-Sectional Structure of Semiconductor Memory Device

Next, a cross-sectional structure of the memory cell array 11 in the semiconductor memory device 10 of the first embodiment will be described with reference to FIG. 5. FIG. 5 is a cross-sectional view taken along line A1-A2 shown in FIG. 4, and shows a cross-sectional structure of the memory cell array 11.

As shown in FIG. 5, the stacked body 30 is provided above the semiconductor substrate 100. Memory pillars MP extending in the Z direction are provided in the stacked body 30 above the substrate 100.

The substrate 100 includes a semiconductor layer 101 and a semiconductor layer 102. The semiconductor layer 101 may be a silicon monocrystalline layer (silicon monocrystalline bulk substrate) or a silicon layer formed by epitaxial growth. The semiconductor layer 102 is provided on the semiconductor layer 101. The semiconductor layer 102 is a silicon layer formed by epitaxial growth, or a polycrystalline silicon layer (polysilicon layer), for example. The semiconductor layer 102 functions as a source line SL, for example.

The stacked body 30 is provided above the semiconductor layer 102. In the stacked body 30, a plurality of insulation layers 32 and a plurality of conductive layers 31 are alternately stacked in the Z direction. In other words, the stacked body 30 includes insulation layers 32 and conductive layers 31 that are alternately stacked. The conductive layers 31 have a plate-like shape parallel to the XY plane (or the surface of the semiconductor substrate 100). Each conductive layer 31 includes tungsten (W) or polycrystalline silicon, for example.

Each insulation layer 32 is provided between conductive layers 31 stacked in the Z direction. Accordingly, the conductive layers 31 stacked in the Z direction are isolated from each other by the insulation layers 32. An insulation layer 32 includes silicon oxide, for example.

An insulation layer 33 is provided on the stacked body 30. The insulation layer 33 includes silicon oxide, for example.

An intersection where a memory pillar MP crosses at least the uppermost (on the side of the insulation layer 33) conductive layer 31 of the plurality of conductive layers 31 in the stacked body 30 functions as a drain-side select transistor ST1. Intersections where the memory pillar MP crosses the one to four uppermost conductive layers 31 may function as drain-side select transistors ST1. One or more conductive layers 31 corresponding to the select transistors ST1 function as drain-side select gate lines SGD.

An intersection where the memory pillar MP crosses at least the lowermost (on the side of the substrate 100) conductive layer 31 of the plurality of conductive layers 31 in the stacked body 30 functions as a source-side select transistor ST2. Intersections where the memory pillar MP crosses the one to four lowermost conductive layers 31 may function as source-side select transistors ST2. One or more conductive layers 31 corresponding to the select transistors ST2 function as source-side select gate lines SGS.

Each of the conductive layers 31 arranged between the select gate lines SGD and the select gate lines SGS (namely, each of the conductive layers 31 other than the conductive layers 31 as the select gate lines SGD and SGS) functions as a word line WL. Intersections where the memory pillar MP crosses the conductive layers 31 as word lines WL function as memory cell transistors MT. One or more conductive layers 31 as word lines WL may be used as dummy word lines.

As described above, the plurality of columnar memory pillars MP are provided through the stacked body 30 including the plurality of insulation layers 32 and conductive layers 31, and the insulation layer 33. Each memory pillar MP extends to penetrate the insulation layer 33, insulation layers 32, and conductive layers 31 in the Z direction (stacking direction), and reaches the semiconductor substrate 100 from the top surface of the insulation layer 33. In other words, a memory pillar MP extends from the top surface of the insulation layer 33 through the select gate line SGD, the word lines WL, and the select gate line SGS, and is coupled to the source line SL.

1.2.2.1 Structure of Memory Pillar MP

The structure of the memory pillar MP (NAND string NS) will be described.

As shown in FIG. 3, one end of the memory pillar MP is coupled to the conductive layer 35 (e.g., a bit line BL) via a contact plug CP and a via plug V1. The other end of the memory pillar MP is coupled to the semiconductor substrate 100 (e.g., a source line SL). Hereinafter, a part of the memory pillar MP on the bit line side of the NAND string NS will be referred to as an upper part of the memory pillar MP. A part of the memory pillar MP on the source line side of the NAND string NS will be referred to as a lower part (or bottom part) of the memory pillar MP.

As shown in FIG. 5, the memory pillar MP includes a memory layer 40, a semiconductor layer 41, a core insulation layer 42A, a core insulation layer 42B on the core insulation layer 42A, and a cap layer 43 on the core insulation layer 42B that are sequentially provided from the side surface side of the conductive layers 31 and the insulation layers 32, for example. The core insulation layer 42A is provided in the lower part or the bottom part of the memory pillar MP. The core insulation layer 42B is provided on the core insulation layer 42A. The core insulation layer 42B has an air gap 44 therein. The air gap 44 is an air layer, a space, or a cavity surrounded by the core insulation layer 42B.

The detailed structure of the memory pillar MP will be described with reference to FIG. 6. FIG. 6 is a cross-sectional view showing a structure of the memory pillar MP according to the first embodiment.

The stacked body 30 is provided on the semiconductor layer 102, and the insulation layer 33 is provided on the stacked body 30. An insulation layer 32A is provided between the lowermost insulation layer 32 and the semiconductor layer 102. The insulation layer 32A includes silicon oxide, for example. The stacked body 30 has a plurality of holes (through-holes) for providing a plurality of memory pillars MP. Hereinafter, a hole in which a memory pillar MP is to be provided will be referred to as a memory hole MH.

In each memory hole MH, a memory pillar MP including a memory layer 40, a semiconductor layer 41, core insulation layers 42A and 42B, and a cap layer 43 is provided.

The memory layer 40 extends in the Z direction along the side surface of the stacked body 30, namely, along the inner wall of the memory hole MH. The memory layer 40 has a block insulation layer 40A, a charge storage layer 40B, and a tunnel insulation layer 40C. Specifically, the block insulation layer 40A is provided on the inner wall of the memory hole MH for forming a memory pillar MP. The charge storage layer 40B is provided on the inner wall of the block insulation layer 40A. Furthermore, the tunnel insulation layer 40C is provided on the inner wall of the charge storage layer 40B.

The semiconductor layer 41 has a cylindrical shape, for example, is provided on the semiconductor layer 102, and extends along the Z direction along the side surface of the memory layer 40. In other words, the semiconductor layer 41 is provided on the semiconductor layer 102 and on the inner wall of the tunnel insulation layer 40C.

A semiconductor layer 102A is provided between the semiconductor layer 41 and the semiconductor layer 102. The semiconductor layer 102A is directly in contact with the semiconductor layer 41. The semiconductor layer 102A is a crystalline silicon layer, for example. The semiconductor layer 102A is formed by epitaxial growth using the semiconductor layer 102 as a base, and is continuous with the semiconductor layer 102. The upper end of the semiconductor layer 102A is arranged on the side surface of the lowermost insulation layer 32. For example, the lower end of the semiconductor layer 102A is located closer to the bottom of the substrate 100 than the boundary region between the semiconductor layer 102 and the insulation layer 32A, with respect to the Z direction.

The block insulation layer 40A extends in the Z direction, and is bent at the boundary with the semiconductor layer 102A along the XY plane. In other words, the block insulation layer 40A has an L-shape including a part extending along the Z direction and a part extending along the XY plane in a cross-section along the YZ plane (or the Z direction). Similarly, the charge storage layer 40B extends in the Z direction, and is bent in the vicinity of the boundary with the semiconductor layer 102A along the XY plane. In other words, the charge storage layer 40B has an L-shape including a part extending along the Z direction and a part extending along the XY plane in a cross-section along the YZ plane (or the Z direction).

The core insulation layers 42A and 42B are provided on the inner wall of the semiconductor layer 41. Specifically, the core insulation layer 42A is provided on the bottom surface and the side surface of the inner wall of the semiconductor layer 41. The core insulation layer 42A fills an area surrounded by the bottom surface and the side surface of the inner wall of the semiconductor layer 41, without having an air gap.

For example, the core insulation layer 42A is provided from the bottom surface of the inner wall of the semiconductor layer 41 (or the bottom surface of the memory pillar MP) to a position higher than (or above) the portion where the block insulation layer 40A or the charge storage layer 40B is bent along the XY plane. The top surface (or the upper end) of the core insulation layer 42A may reach a position higher than (or above) a conductive layer 31 corresponding to the select gate line SGS or the lowermost word line WL. The core insulation layer 42A at least includes either one of silicon oxide or polysilazane, for example. Polysilazane includes silicon (Si), nitrogen (N), and hydrogen (H).

The core insulation layer 42B is provided on the side surface of the semiconductor layer 41 on the core insulation layer 42A. The core insulation layer 42B extends in the Z direction along the side surface of the semiconductor layer 41. The core insulation layer 42B includes silicon oxide and does not include polysilazane, for example.

For example, an air gap 44 may be provided in the memory pillar MP. In other words, the core insulation layer 42B may have the air gap 44 therein. The air gap 44 is an air layer, a space, or a cavity surrounded by the core insulation layer (for example, a silicon dioxide layer) 42B. The bottom of the air gap 44 is located at a position higher than the portion where the block insulation layer 40A or the charge storage layer 40B is bent along the XY plane.

Furthermore, the cap layer 43 is provided on the core insulation layer 42B. The cap layer 43 is provided on the core insulation layer 42B on the upper end side of the memory pillar MP. The cap layer 43 includes a silicon layer or a conductive layer, for example.

The semiconductor layer 41 functions as a channel layer for the memory cell transistor MT and the select transistors ST1 and ST2. The channel layer is a film through which carriers flow when performing data write/delete and data read of each memory cell transistor MT. Thus, it is important, in terms of the structure, to evenly form the semiconductor layer 41 with a predetermined film thickness along the memory film 40 in the memory pillar MP.

The charge storage layer 40B is provided between the block insulation layer 40A and the tunnel insulation layer 40C. The charge storage layer 40B is a film that has a characteristic of capturing and storing electric charges supplied from the semiconductor layer 41 having a higher potential upon writing data. Upon deleting data, the charge storage layer 40B discharges the stored electric charges into the semiconductor layer 41. The charge storage layer 40B includes silicon nitride, for example. The threshold voltage (on voltage) of the memory cell transistor MT varies according to the charge amount in the charge storage layer 40B. The memory cell transistor MT of the semiconductor memory device 10 can store data of 1 bit or more based on association between the threshold voltage of the memory cell transistor MT (ON/OFF of the memory cell) and data.

The tunnel insulation layer 40C is provided between the semiconductor layer 41 and the charge storage layer 40B. The tunnel insulation layer 40C functions as a potential barrier when electric charges are injected from the semiconductor layer 41 into the charge storage layer 40B, or when the charges stored in the charge storage layer 40B diffuse into the semiconductor layer 41. The tunnel insulation layer 40C includes silicon oxide, for example.

The block insulation layer 40A is provided between the conductive layers 31 and the charge storage layer 40B. The block insulation layer 40A prevents the electric charges stored in the charge storage layer 40B from diffusing into the conductive layers (word lines WL) 31. The block insulation layer 40A includes silicon oxide and silicon nitride, for example.

1.3 Manufacturing Method of Semiconductor Memory Device

Figure 7:
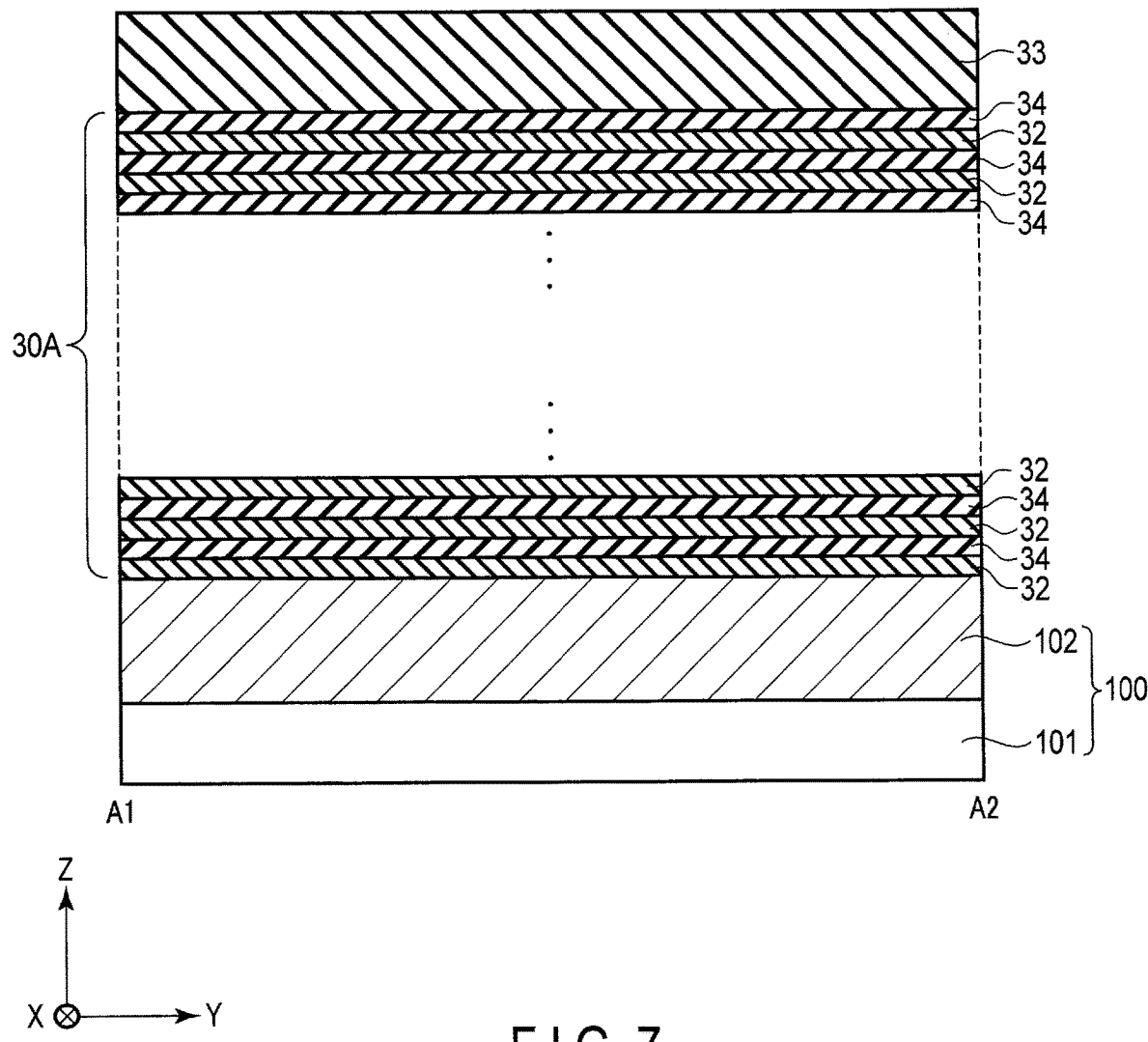

A manufacturing method of the semiconductor memory device according to the first embodiment will be described. FIGS. 7 to 15 are cross-sectional views of structures in manufacturing steps of the semiconductor memory device according to the first embodiment. FIGS. 7 to 9 are cross-sectional views taken along line A1-A2 shown in FIG. 3. FIGS. 10 to 15 are cross-sectional views of the area where the memory pillar MP should be formed, taken along line A1-A2.

First, as shown in FIG. 7, insulation layers 32 and sacrifice layers 34 are alternately stacked on the substrate 100.

Specifically, for example, an insulation layer 32 (and an insulation layer 32A) is formed on the semiconductor layer 102 of the substrate 100 by the chemical vapor deposition (CVD) method. Then, a sacrifice layer 34 is formed on the insulation layer 32 by the CVD method, for example. Further, an insulation layer 32 is formed on the sacrifice layer 34. In this manner, insulation layers 32 and sacrifice layers 34 are alternately formed on the semiconductor layer 102. A stacked body in which the insulation layers 32 and the sacrifice layers 34 are alternately formed will be referred to as a "stacked body 30A". The insulation layer 32 includes silicon oxide, for example. The sacrifice layer 34 has selectivity relative to the insulation layer 32. A sacrifice layer 34 includes an insulation layer such as silicon nitride, for example. In the above manner, the stacked body 30A is formed on the substrate 100.

Herein, it is preferable to select materials for the sacrifice layers 34 and the insulation layers 32 so that the etching selection ratio between the sacrifice layers 34 and the insulation layers 32 is large. As described above, for example, if the insulation layers 32 are made of silicon oxide, the sacrifice layers 34 are made of silicon nitride or silicon germanium.

Next, an insulation layer 33 is formed on the uppermost sacrifice layer 34 by the CVD method, for example. Afterwards, a top surface of the insulation layer 33 is flattened by a chemical mechanical polishing (CMP) method, for example.

The number of the sacrifice layers 34 in the stacked body 30A corresponds to the number of word lines WL and the select gate lines SGD and SGS in the string unit (or the NAND string).

Before formation of the stacked body 30A, for example, a circuit (not shown) including a transistor and a wire may be formed in the area of the semiconductor layer 101. The circuit including the transistor and the wire constitutes a peripheral circuit that operates the semiconductor memory device (NAND flash memory) 10.

Next, as shown in FIG. 8, a plurality of memory holes MH are formed in the Z direction in the areas of the stacked body 30A where memory pillars MP will be formed.

Specifically, for example, a mask layer 90 is formed on the insulation layer 33. A plurality of memory holes MH are formed in the areas of the stacked body 30A where memory pillars MP should be formed, by photolithography and etching, by using the mask layer 90 having openings.

The memory holes MH penetrate the insulation layers 32 and 33 and the sacrifice layers 34. The memory holes MH reach the semiconductor layer 102 from the insulation layer 33. For formation of the memory holes MH, anisotropic etching such as Reactive Ion Etching (RIE) is used, for example.

After formation of the memory holes MH, for example, a crystalline layer (not shown) may be formed on the surface (exposed surface) of the semiconductor layer 102 by a metal induced lateral crystallization (MILC) method, for example.

Next, as shown in FIGS. 9 and 10, the memory layer 40 and the semiconductor layer 41 are sequentially formed on the side surface of the stacked body 30A in the memory holes MH (the inner walls of the memory holes MH). FIG. 10 is an enlarged view of a memory hole MH shown in FIG. 9.

Specifically, as shown in FIG. 10, the semiconductor layer 102A is formed on the semiconductor layer 102 in the memory hole MH. Subsequently, a block insulation layer 40A, a charge storage layer 40B, and a tunnel insulation layer 40C are sequentially formed on the side surface of the stacked body 30A above the semiconductor layer 102A in the memory hole MH by the CVD method, for example. As a result, a memory layer 40 is formed on the inner wall of the memory hole MH.

After removing the memory layer 40 on the semiconductor layer 102A (at the bottom of the memory hole MH), a semiconductor layer 41 is formed on the side surfaces of the semiconductor layer 102A and the tunnel insulation layer 40C in the memory hole MH by the CVD method, for example, as shown in FIG. 10. The semiconductor layer 41 includes polysilicon, for example.

At this time, the film thickness of the semiconductor layer 41 (e.g., duration for forming the semiconductor layer 41) is controlled to prevent the semiconductor layer 41 from filling the inside of the memory hole MH. Upon removal of the memory layer 40 at the bottom of the memory hole MH, a protection layer (e.g., a silicon layer) may be formed on the memory layer 40 on the side surface of the memory hole MH before removal of the memory layer 40 so that the memory layer 40 on the side surface of the memory hole MH is not removed (or deteriorated).

Figure 11:
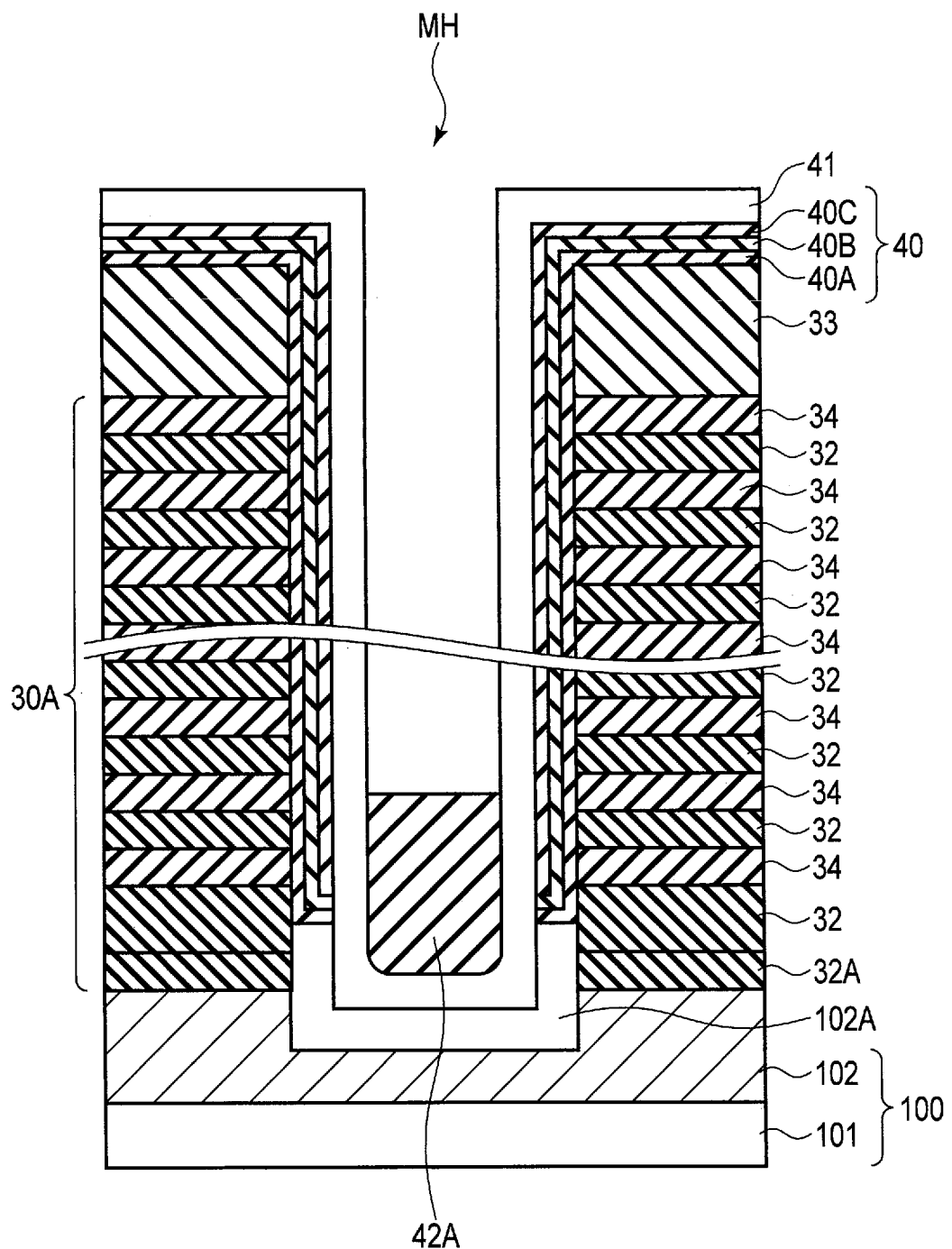

Next, as shown in FIG. 11, a core insulation layer 42A is formed on the bottom surface and the side surface of the semiconductor layer 41 in the memory hole MH.

Specifically, for example, a solution in which polysilazane is dissolved is dropped on a wafer including the substrate 100 with a structure shown in FIG. 10, and the solution is applied on the wafer by spin coating. Then, the wafer is subjected to a necessary heat treatment. As a result, as shown in FIG. 11, the core insulation layer 42A as a spin-on glass (SOG) layer is formed on the bottom surface and the side surface of the semiconductor layer 41 in the memory hole MH. In other words, the solution containing polysilazane has good wettability, and evenly flows on the bottom surface and the side surface of the memory hole MH. Thus, the core insulation layer 42A fills the bottom part of the memory hole MH without an air gap. The core insulation layer 42A may be formed as a SOG layer by applying a solution in which silicon oxide is dissolved on the wafer, or may be formed by using the CVD method, for example.

Figure 12:
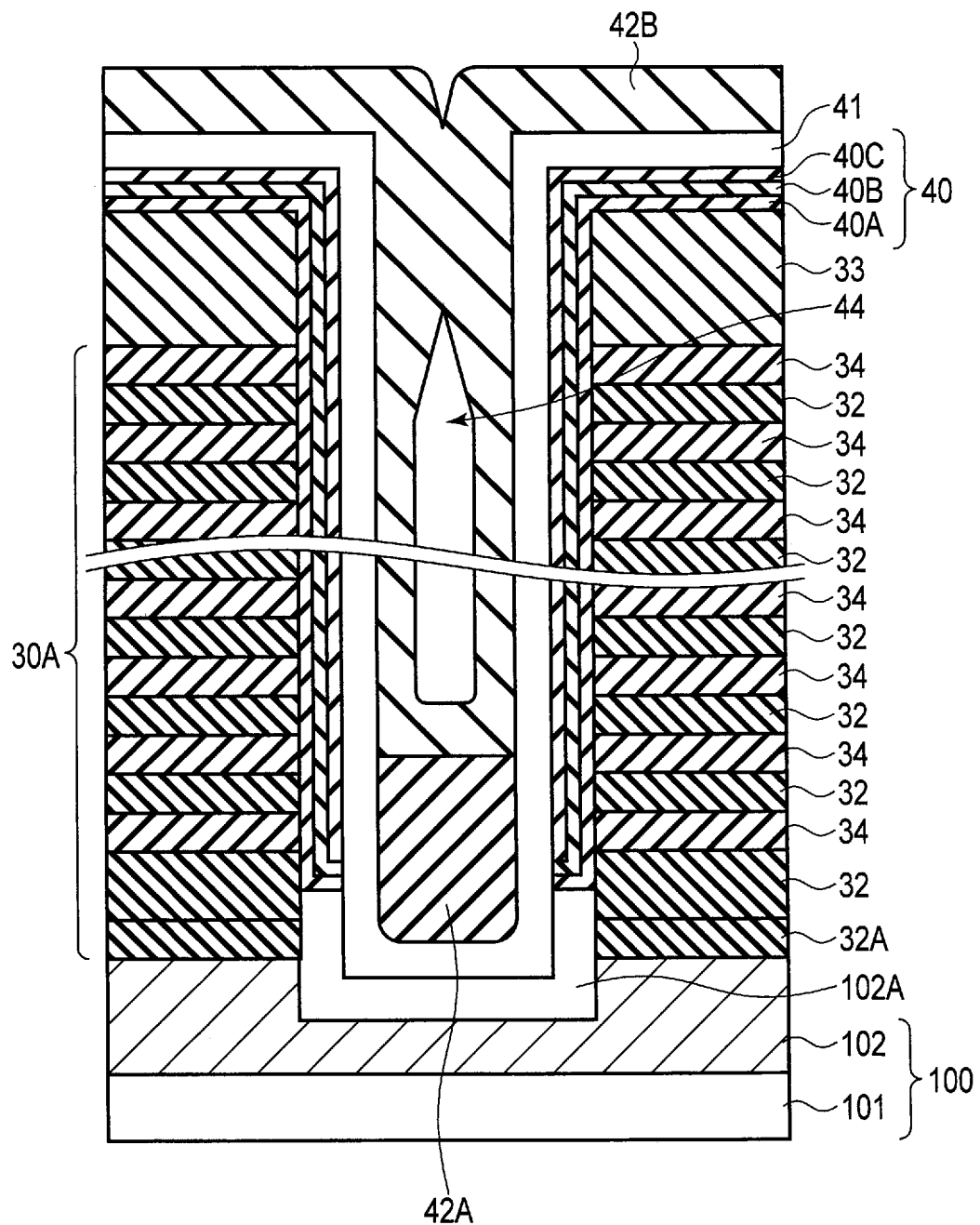

Next, as shown in FIG. 12, a core insulation layer 42B is formed on the core insulation layer 42A and the side surface of the semiconductor layer 41 above the core insulation layer 42A in the memory hole MH.

Specifically, the core insulation layer 42B is formed on the core insulation layer 42A in the memory hole MH, and on the side surface of the semiconductor layer 41 above the core insulation layer 42A, by the CVD method, for example.

At this time, there is a case where the core insulation layer 42B closes the opening of the memory hole MH before filling the inside of the memory hole MH. In such a case, the air gap 44 is formed in the memory hole MH (memory pillar MP). As a result, the memory pillar MP has a structure in which the core insulation layer 42B includes the air gap 44 inside.

Figure 13:
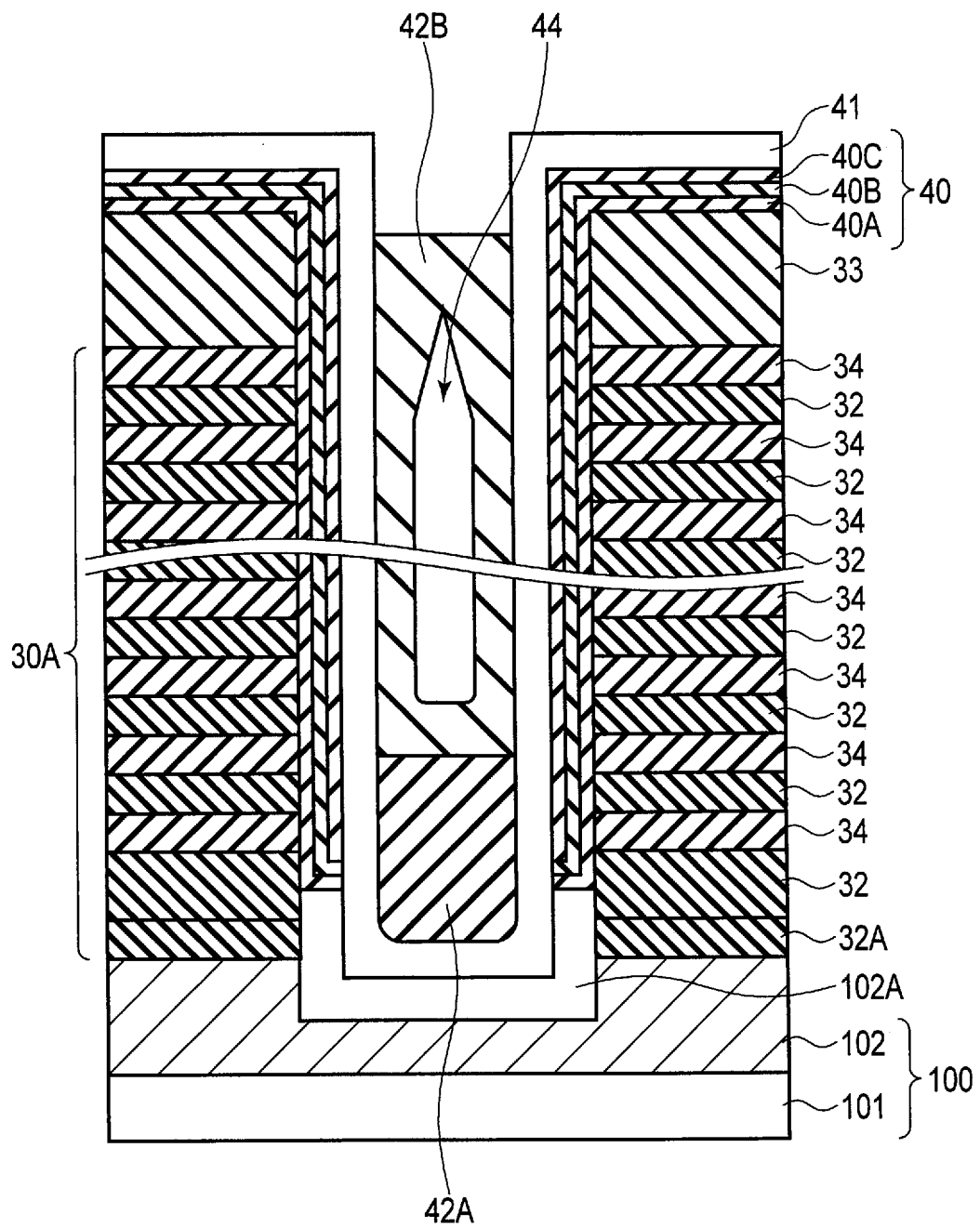

Next, as shown in FIGS. 13 to 15, a cap layer 43 is formed on the core insulation layer 42B and the side surface of the semiconductor layer 41 above the core insulation layer 42B in the memory hole MH.

Specifically, as shown in FIG. 13, the core insulation layer 42B on the memory hole MH and above the insulation layer 33 is removed by etchback, for example.

Next, as shown in FIG. 14, a conductive layer 43A is formed on the structure shown in FIG. 13, namely in the memory hole MH where a part of the core insulation layer 42B is removed, by the CVD method.

Then, the structure shown in FIG. 14, namely the top surface of the memory hole MH where the conductive layer 43A is formed, is subjected to the CMP method. As a result, as shown in FIG. 15, the top surface of the memory hole MH is flattened, and the cap layer 43 is formed on the core insulation layer 42B. Through the above steps, a memory pillar MP is formed.

After that, a step of replacing the sacrifice layers 34 with conductive layers 31, a step of coupling wires to the conductive layers 31 and the memory pillar MP, and a step of forming a contact plug, a via plug, wires, and interlayer insulation layers, etc. are performed, for example.

Specifically, for example, slits (not shown) are formed at the end of the stacked body 30A and at the boundary of the string units. Then, the sacrifice layers 34 are removed by etching through the slits. Conductive layers 31 are formed in the spaces between the insulation layers 32 where the sacrifice layers 34 are removed. Thereby, the word lines WL and select gate lines SGD and SGS are formed.

As a result, as shown in FIG. 6, conductive layers 31 as word lines WL are formed around the memory pillar MP, thereby forming memory cell transistors MT. A conductive layer 31 as a select gate line SGD is formed around the memory pillar MP, thereby forming a select transistor ST1. A conductive layer 31 as a select gate line SGS is formed around the memory pillar MP, thereby forming a select transistor ST2.

After formation of the conductive layers 31, the slits are filled with an insulation layer (not shown). A plurality of contact plugs and via plugs are formed to be coupled to the memory pillars MP and the conductive layers 31. Furthermore, wires (e.g., bit lines BL) to be coupled to the contact plugs or the via plugs are formed.

The manufacturing of the semiconductor memory device 10 according to the first embodiment is completed with the above manufacturing method.

1.4 Advantageous Effect of First Embodiment

According to the first embodiment, it is possible to provide a semiconductor memory device that can improve reliability of operations.

A problem of a memory pillar MP of a semiconductor memory device according to a comparative example will be described below. In the memory pillar MP of the comparative example, after a memory hole MH is formed, a memory layer, a semiconductor layer, and a core insulation layer are sequentially formed on a side wall of the memory hole MH. If a core insulation layer is deposited by the CVD method, etc. subsequently to the formation of the memory layer, the core insulation layer may close the space inside the memory hole MH and form a gap inside the memory pillar MP (what is called an air gap).

If this air gap is formed inside the memory pillar MP, particularly in a lower part of the memory pillar MP, the semiconductor layer as a channel layer provided on the side wall of the memory layer may be oxidized and become thinner in the following oxidization step. There is therefore a concern that this may cause an increase in the resistance value of the semiconductor layer and breaking of the semiconductor layer, and thus the semiconductor layer will not function as a channel layer, which leads to loss of reliability of operations of the semiconductor memory device.

On the other hand, according to the first embodiment, the core insulation layer 42A fills the inside of the semiconductor layer 41 in the lower part of the memory pillar MP; in other words, the core insulation layer 42A without the air gap 44 is provided on the bottom surface and the side surface of the semiconductor layer 41 in the lower part of the memory pillar MP. Thus, according to the first embodiment, oxidization of the semiconductor layer 41 provided between the memory layer 40 and the core insulation layer 42A is suppressed in the oxidization step after formation of the core insulation layer 42B, which reduces thinning of the semiconductor layer. This prevents increase in the resistance value and breaking of the semiconductor layer 41 in the lower part of the memory pillar MP. As a result, occurrence of connection failures and breaking between the NAND string NS and the source line SL can be reduced, which leads to increase in reliability of operations.

2. Second Embodiment

A semiconductor memory device according to a second embodiment will be described. The second embodiment is an example of preventing thinning of the semiconductor layer 41 in the lower part of the memory pillar MP, and remedying the unevenness of the semiconductor layer 41 in the upper part of the memory pillar MP, similarly to the first embodiment.

The circuit block configuration, the layout structure, and the cross-sectional structure of the semiconductor memory device according to the second embodiment are the same as the first embodiment. In the following, a structure and a manufacturing method of a memory pillar MP different from the first embodiment will be described.

2.1 Structure of Memory Pillar MP

Next, a detailed structure of the memory pillar MP will be described. FIG. 16 is a cross-sectional view of a structure of a memory pillar MP according to the second embodiment.

The structures of a stacked body 30, an insulation layer 33, and a memory pillar MP provided on a semiconductor layer 102 are the same as those in the first embodiment.

In the second embodiment, a film thickness T1 of a portion (hereinafter referred to as a "upper part silicon layer") 410 of a semiconductor layer (e.g., a silicon layer) 41 on the upper side of the memory pillar MP is greater than a film thickness T2 of a portion (hereinafter referred to as a "middle part silicon layer") 412 of the semiconductor layer 41 in the middle part of the memory pillar MP. A film thickness T3 of a portion (hereinafter referred to as a "lower part silicon layer") 414 of the semiconductor layer 41 on the bottom side of the memory pillar MP is smaller than the film thickness T2 of the middle part silicon layer 412. For example, the middle part of the memory pillar MP corresponds to a part in the vicinity of an approximate midpoint of the length (height) H of the memory pillar MP, with respect to the direction (the Z direction) perpendicular to the surface of a substrate 100.

In terms of tendency of the crystallinity (crystalloid), the entire or a large part of the upper part silicon layer 410 may include crystals with a grain diameter smaller than that of crystals in the middle part silicon layer 412 and the lower part silicon layer 414. For example, the upper part silicon layer 410 is an amorphous silicon layer or a microcrystalline silicon layer. A microcrystal is a crystal having a particle diameter of 200 nm or smaller; for example, a crystal about 50 nm to 100 nm. A microcrystalline layer is constituted by a plurality of crystals which are 200 nm or smaller. A polysilicon layer (polysilicon region) may be formed in a part of the upper part silicon layer 410. In this case, the upper part silicon layer 410 includes an amorphous silicon region (and/or a microcrystalline silicon region) and a polysilicon region.

The middle part silicon layer 412 and the lower part silicon layer 414 of the semiconductor layer 41, which are lower than the upper part silicon layer 410, are polysilicon layers, for example.

The upper part silicon layer 410 includes at least one impurity selected from boron (B), carbon (C), germanium (Ge), fluorine (F), argon (Ar), xenon (Xe), and molecules resulting from $BF_2$, for example. These impurities are ion species used for ion implantation for transforming a polysilicon layer into an amorphous silicon layer.

A concentration of the selected impurity in the upper part silicon layer 410 is higher than concentrations of the selected impurities in the middle part silicon layer 412 and the lower part silicon layer 414. However, there is a case where the impurity concentration in the upper part silicon layer 410 is substantially the same as the impurity concentrations in the middle part silicon layer 412 and the lower part silicon layer 414. If the upper part silicon layer 410 includes boron, the upper part silicon layer 410 may include fluorine in addition to boron. Argon and xenon may be desorbed from the semiconductor layer 41.

Furthermore, core insulation layers 42A and 42B are provided on the inner wall of the semiconductor layer 41. Specifically, the core insulation layer 42A is provided on the bottom surface and the side surface of the inner wall of the lower part silicon layer 414 and on the side surface of the inner wall of the middle part silicon layer 412. The core insulation layer 42A does not have an air gap, and fills the area surrounded by the bottom surface and the side surface of the inner wall of the lower part silicon layer 414.

For example, the core insulation layer 42A is provided from the bottom surface of the inner wall of the semiconductor layer 41 (or the bottom surface of the memory pillar MP) to a position higher than (or above) a portion where the block insulation layer 40A or the charge storage layer 40B is bent along the XY plane. The top surface of the core insulation layer 42A may reach a position higher than (or above) a conductive layer 31 corresponding to the select gate line SGS or the lowermost word line WL.

The core insulation layer 42B is provided on the side surface of the middle part silicon layer 412 and the side surface of the upper part silicon layer 410 above the core insulation layer 42A. The core insulation layer 42B extends in the Z direction along the side surface of the middle part silicon layer 412 and the upper part silicon layer 410.

For example, the core insulation layer 42B may have an air gap 44 therein. The air gap 44 is an air layer, a space, or a cavity surrounded by the core insulation layer 42B. The bottom of the air gap 44 is located at a position higher than a portion where the block insulation layer 40A or the charge storage layer 40B is bent along the XY plane.

The boundary surface between the lower part silicon layer 414 and the core insulation layer 42A has a curved surface. In other words, the boundary surface between the lower part silicon layer 414 and the core insulation layer 42A has a U-shape (or a C-shape).

In the second embodiment, if the semiconductor layer 41 on the upper side of the memory pillar MP (the upper part silicon layer 410) is in an amorphous state, the flatness of the upper part silicon layer 410 in the amorphous state is improved. This reduces defects caused in the stacked body 30A or the NAND string NS, when etching the core insulation layer.

2.2 Manufacturing Method of Semiconductor Memory Device

Figure 17:
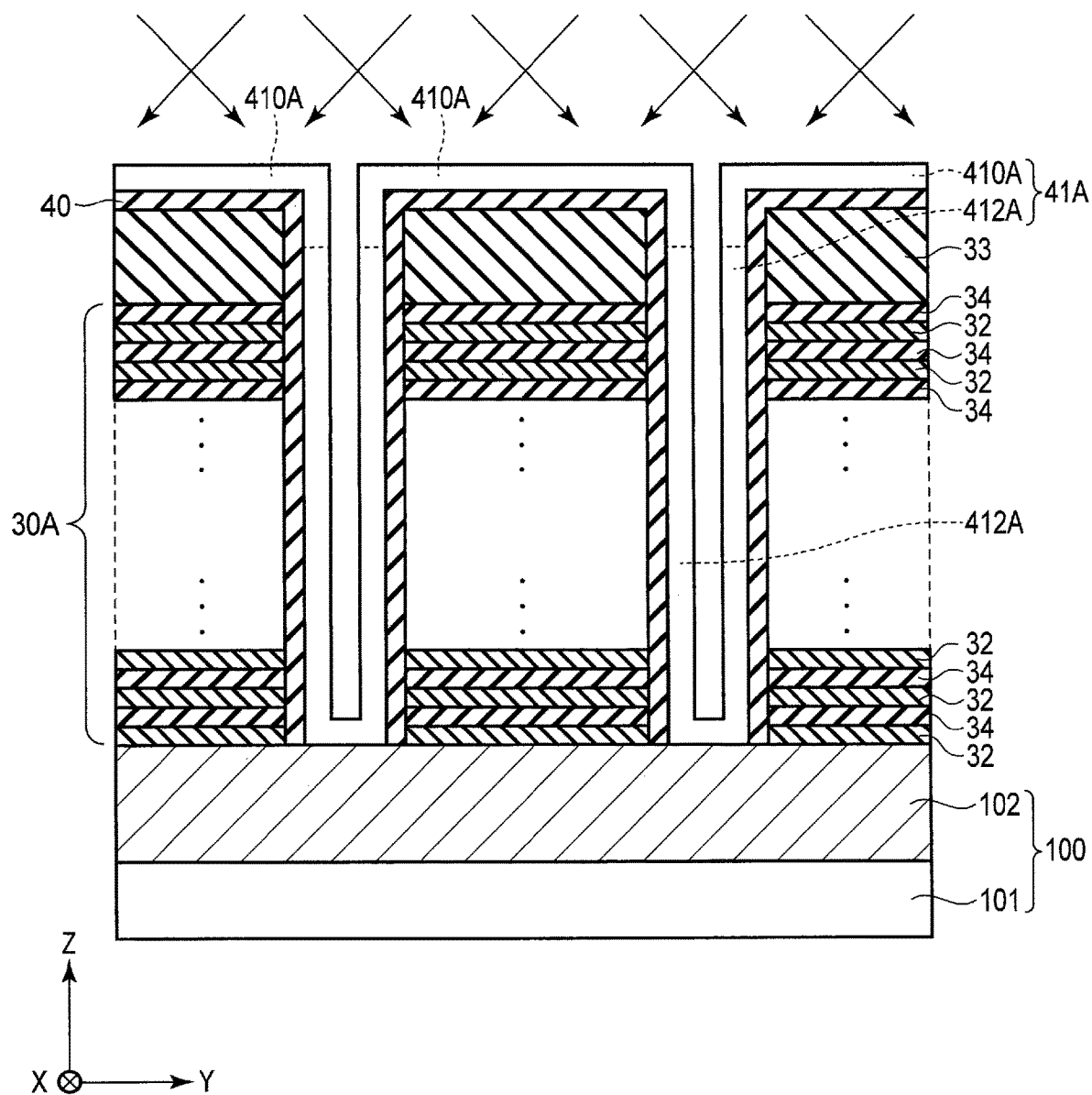
FIG. 17 is a cross-sectional view of a structure in a manufacturing step of the semiconductor memory device, taken along line A1-A2, according to the second embodiment.

Next, a manufacturing method of the semiconductor memory device according to the second embodiment will be described. FIGS. 17 to 24 are cross-sectional views of structures in manufacturing steps of the semiconductor memory device according to the second embodiment. FIG. 17 is a cross-sectional view taken along line A1-A2 shown in FIG. 3. FIGS. 18 to 24 are cross-sectional views of the area where the memory pillar MP should be formed, taken along line A1-A2.

First, similarly to the first embodiment, insulation layers 32 and sacrifice layers 34 are alternately stacked on the substrate 100 as shown in FIG. 7. Next, as shown in FIG. 8, memory holes MH are formed in the Z direction in the area of the stacked body 30A where memory pillars MP should be formed. Next, as shown in FIG. 9, the memory layer 40 and the semiconductor layer 41 are sequentially formed on the side surface of the stacked body 30A in the memory holes MH (the inner walls of the memory holes MH).

Figure 18:
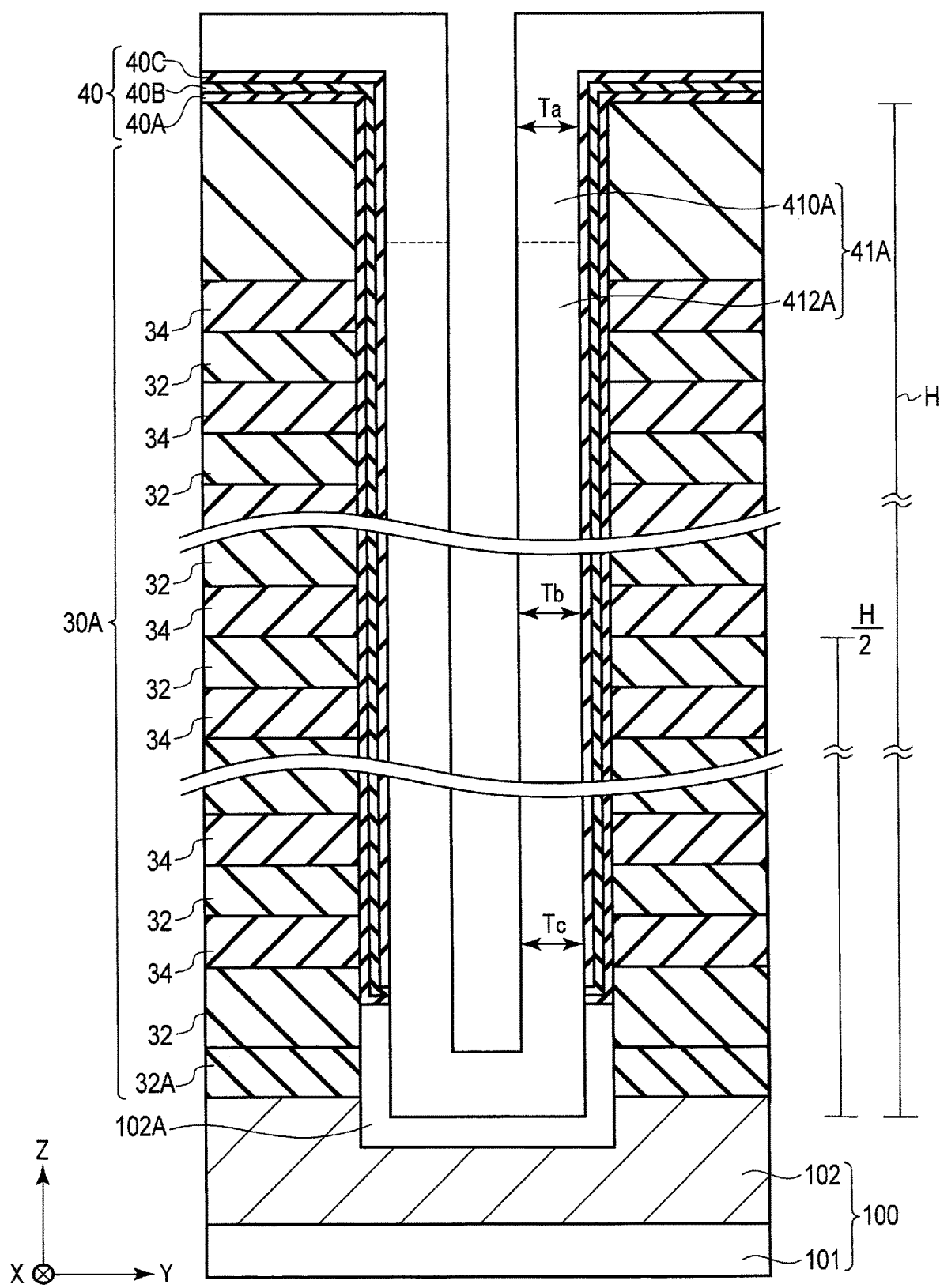

Next, as shown in FIGS. 17 and 18, the semiconductor layer 41 on the upper side of the stacked body 30A is subjected to a treatment for amorphization (hereinafter referred to as "an amorphizing treatment"), and the upper part silicon layer 410 is amorphized.

Specifically, ion implantation (ion irradiation) or a plasma treatment as the amorphizing treatment is performed to the upper part silicon layer (the portion on the opening side of the memory hole) of the semiconductor layer 41. If the semiconductor layer 41 is amorphized by ion implantation, at least one of boron, carbon, germanium, argon, xenon, fluorine, $BF_2$, etc. is selected as an ion species for ion implantation for amorphization.

The portion of the semiconductor layer 41A in which ions are implanted (added) is amorphized by destruction of crystal grains by ion collision, or by chemical reaction of a silicon element with an element forming the ion species.

As a result, as shown in FIGS. 17 and 18, the portion 410A of the semiconductor layer 41A, to which ions are implanted or which is exposed to plasma as an amorphization treatment, shifts from a polycrystalline state to an amorphous state. On the other hand, a portion 412A of the semiconductor layer 41A, to which ions are not implanted or which is not exposed to plasma, maintains the polycrystalline state. The portion in the amorphous state (an amorphous silicon layer) 410A is a continuous layer with the portion in the polycrystalline state (a polysilicon layer) 412A.

If the portion (the amorphous silicon layer) 410A of the semiconductor layer 41A is formed by a plasma treatment, for example, ion implantation using the above ion species (e.g., ion implantation of boron or carbon) is performed to the portion 410A after the plasma treatment.

Figure 19:
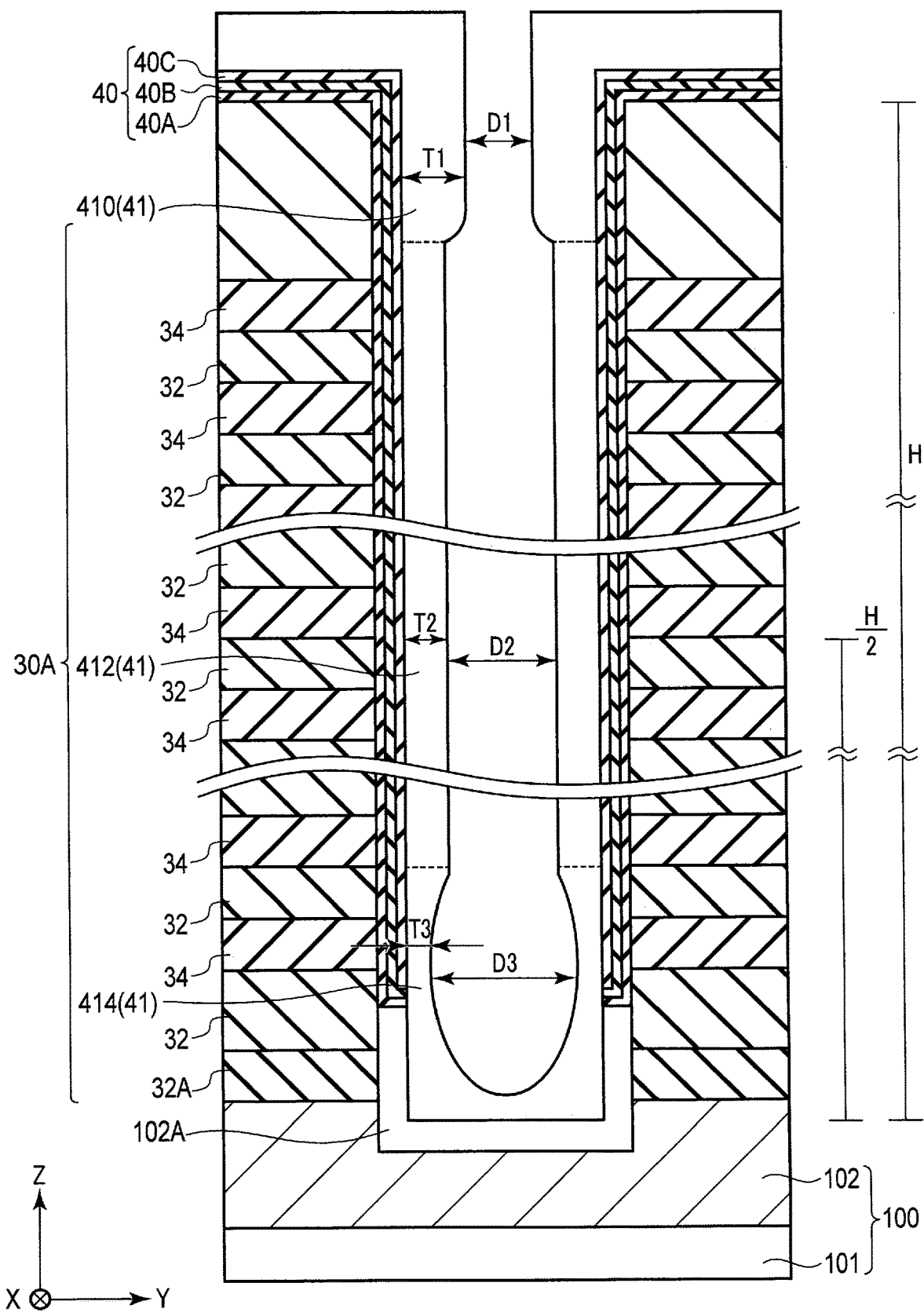

Next, after performing the amorphization treatment to the portion 410A on the upper side of the semiconductor layer 41A, the semiconductor layer 41A is slimmed as shown in FIG. 19. The slimming of the semiconductor layer 41A is performed by chemical dry etching (CDE) such as RIE and gas etching, or wet etching. This reduces the film thickness of the semiconductor layer 41.

Specifically, the upper part silicon layer 410 of the semiconductor layer 41 has a relatively flat surface. Thus, the upper part silicon layer 410 is etched relatively evenly.

Next, after the slimming of the semiconductor layer 41, the core insulation layer 42A is formed on the bottom surface and the side surface of the semiconductor layer 41 in the memory hole MH, as shown in FIG. 20.

Specifically, similarly to the first embodiment, for example, a solution in which polysilazane is dissolved is applied on a wafer including the substrate 100 having a structure shown in FIG. 19, and then the wafer is subjected to a necessary heat treatment. As a result, as shown in FIG. 20, the core insulation layer 42A as a SOG layer is formed on the bottom surface and the side surface of the lower part silicon layer 414 in the memory hole MH. The solution containing polysilazane has good wettability, and evenly flows on the bottom surface and the side surface of the lower part silicon layer 414. Accordingly, the core insulation layer 42A fills the bottom part of the memory hole MH without an air gap.

Figure 21:
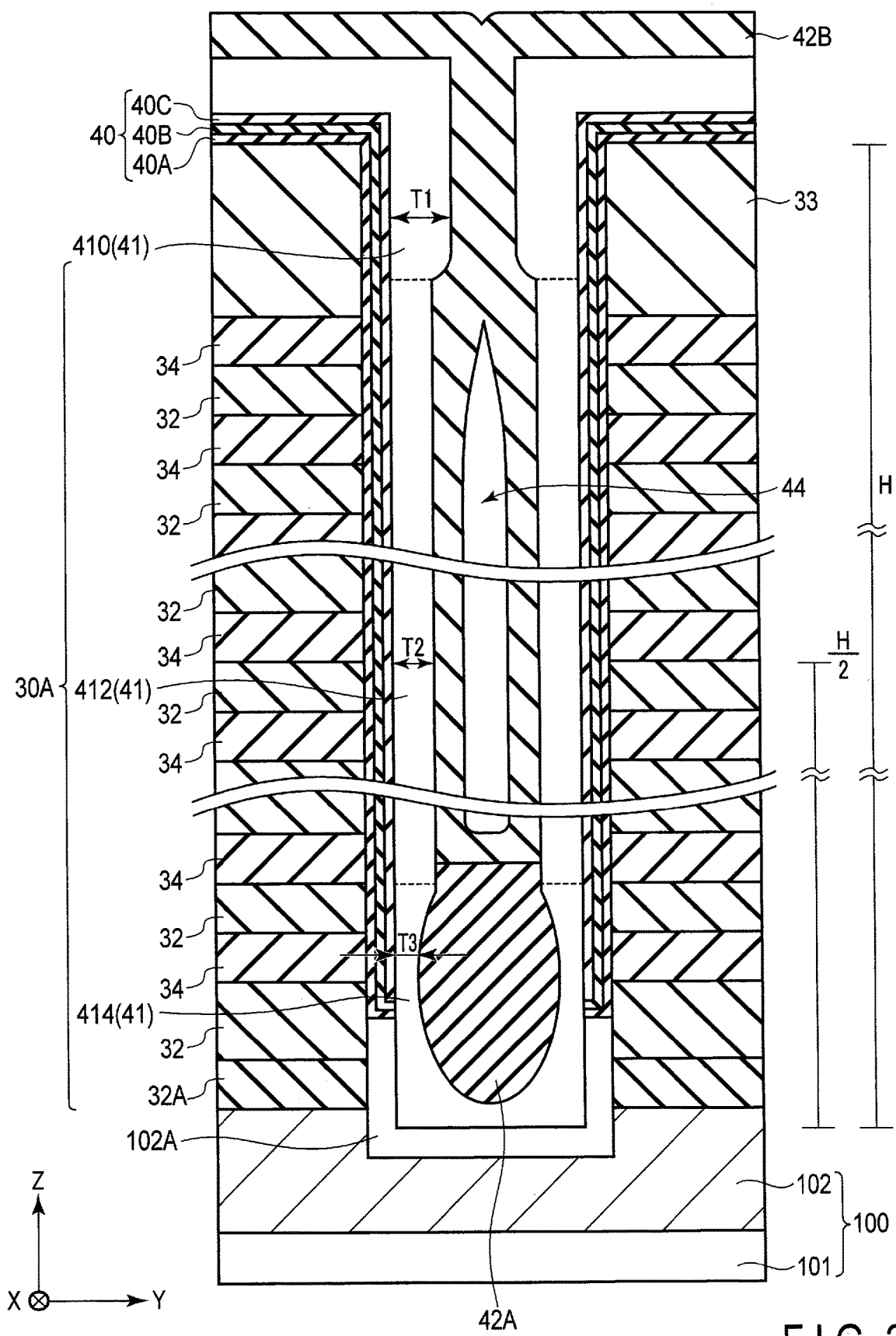

Next, as shown in FIG. 21, a core insulation layer 42B is formed on the core insulation layer 42A and the side surface of the semiconductor layer 41 above the core insulation layer 42A in the memory hole MH. The steps for forming the core insulation layer 42B are the same as the first embodiment.

Next, as shown in FIGS. 22 to 24, a cap layer 43 is formed on the core insulation layer 42B and on the side surface of the semiconductor layer 41 above the core insulation layer 42B in the memory hole MH.

Specifically, as shown in FIG. 22, the core insulation layer 42B on the memory hole MH and above the insulation layer 33 is removed by etchback, for example. As a result, the position of the upper end of the core insulation layer 42B is set back to a position closer to the substrate 100 than the upper part of the stacked body 30A (the top surface of the insulation layer 33).

As described above, the upper part silicon layer 410 on the upper side of the semiconductor layer 41 is an amorphous silicon layer. The top surface (exposed surface) of the upper part silicon layer 410 is relatively homogeneous (flat). The upper part silicon layer 410 that is relatively thick covers the top portion of the stacked body 30A.

Thus, even under etching conditions of silicon oxide when etching the core insulation layer (silicon oxide) 42B, it is possible to suppress occurrence of deficiency (e.g., disruption of a pattern or unintended etching of a layer) of the stacked body 30A and the memory layer 40 caused by the unevenness of the upper part silicon layer 410 (e.g., deficiency caused by a locally thin part of the silicon layer and/or difference in the etching rate caused by difference in crystallinity) since the upper part silicon layer 410 covers the top portion of the stacked body 30A.

Next, as shown in FIG. 23, a conductive layer 43A is formed above the stacked body 30A and on the core insulation layer 42B. The conductive layer 43A is an amorphous silicon layer, for example.

Subsequently, as shown in FIG. 24, the conductive layer 43A, the upper part silicon layer 410, and the memory layer 40 are removed from the top surface of the stacked body 30A by, for example, the RIE method. As a result, a memory pillar MP is formed in the memory hole MH of the stacked body 30A.

Then, slits (not shown) are formed at the end of the stacked body 30A and at the boundary of the string units. Subsequently, the sacrifice layers 34 are removed by etching through the slits. Conductive layers 31 are formed in the spaces between the insulation layers 32 where the sacrifice layers 34 are removed. Thereby, the word lines WL and select gate lines SGD and SGS are formed.

As a result, as shown in FIG. 16, the conductive layers 31 as word lines WL are formed around the memory pillar MP, thereby forming memory cell transistors MT. A conductive layer 31 as a select gate line SGD is formed around the memory pillar MP, thereby forming a select transistor ST1. A conductive layer 31 as a select gate line SGS is formed around the memory pillar MP, thereby forming a select transistor ST2.

After formation of the conductive layers 31, the slits are filled with an insulation layer (not shown). A plurality of contact plugs and via plugs are formed to be coupled to the memory pillars MP and the conductive layers 31. Furthermore, wires (e.g., bit lines BL) to be coupled to the contact plugs and the via plugs are formed.

The upper silicon layer (amorphous silicon layer) 410 of the memory pillar MP may be crystallized (e.g., microcrystalization) by the heat applied to the silicon layer during the manufacturing steps of the NAND flash memory. The upper part silicon layer 410 is transformed to a microcrystalline silicon layer after the core insulation layer 42B is etched. Thus, the flatness of the semiconductor layer 41 is maintained when the core insulation layer 42B is etched.

The manufacturing of the semiconductor memory device 10 according to the second embodiment is completed with the above manufacturing method.

2.3 Advantageous Effect of Second Embodiment

According to the second embodiment, it is possible to provide a semiconductor memory device that can improve reliability of operations, similarly to the first embodiment.

In the second embodiment, a core insulation layer 42A without an air gap 44 is provided in the semiconductor layer 41 in the lower part of the memory pillar MP. Accordingly, oxidization of the semiconductor layer 41 is suppressed in the oxidization step after formation of the core insulation layer 42A, which reduces thinning of the semiconductor layer 41. This reduces occurrence of increase in the resistance value of the semiconductor layer 41 and breaking of the semiconductor layer 41 in the memory pillar MP, and improves reliability of operations.

In the second embodiment, even under etching conditions of silicon oxide when etching the core insulation layer (silicon oxide) 42B, the upper part silicon layer (amorphous silicon layer) 410 that is relatively thick covers the top portion of the stacked body 30A. Therefore, it is possible to suppress occurrence of the deficiency (for example, disruption of a pattern or unintended etching of a layer) of the stacked body 30A and the memory layer 40 caused by unevenness of the upper part silicon layer 410. The unevenness of the upper part silicon layer 410 means that upper part silicon layer 410 has portions which are locally different in thickness and/or that the upper part silicon layer 410 has portions which are locally different in crystallinity. If the upper part silicon layer 410 has unevenness, the pacing of etching at the upper part silicon layer 410 fluctuates, which may cause deficiency such as disruption of a pattern or unintended etching of a layer in the stacked body 30A, and the memory layer 40. According to the second embodiment, occurrence of such deficiency can be reduced.

3. Modifications

In the above embodiments, a NAND flash memory is explained as an example of the semiconductor memory device. However, the above embodiments can be applied to not only a NAND flash memory but also other semiconductor memories in general having a memory pillar MP, and can be applied to various memory devices other than a semiconductor memory.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. These embodiments and modifications thereof are included in the scope and spirit of the invention, and are similarly included in the inventions claimed in the patent claims and in the scope of equivalents of the inventions.

The invention claimed is:

1. A semiconductor memory device comprising:
a base layer;
a plurality of conductive layers stacked above the base layer in a first direction;
an insulation layer extending in the plurality of conductive layers in the first direction;
a semiconductor layer arranged between the insulation layer and the plurality of conductive layers; and
a charge storage layer arranged between the semiconductor layer and the plurality of conductive layers,
wherein the insulation layer comprises:
a first insulation layer containing polysilazane; and
a second insulation layer that is arranged on the first insulation layer and is far from the base layer than the first insulation layer, and
wherein a lower end of the second insulation layer is located higher than an upper end of a lowermost conductive layer of the plurality of conductive layers in the first direction;
wherein a lower end of the charge storage layer is located at a first height between a second height of the lowermost conductive layer of the plurality of conductive layers and a third height of the base layer in the first direction.

2. The semiconductor memory device according to claim 1, wherein
an upper end of the first insulation layer is located higher than the upper end of the lowermost conductive layer of the plurality of conductive layers in the first direction.

3. The semiconductor memory device according to claim 1, wherein
an upper end of the first insulation layer is located higher, in a direction away from the base layer, than the lower end of the charge storage layer.

4. The semiconductor memory device according to claim 1, wherein
the second insulation layer includes an air gap.

5. The semiconductor memory device according to claim 4, wherein
a lower end of the air gap included in the second insulation layer is located higher than a lower end of the charge storage layer in the first direction.

6. The semiconductor memory device according to claim 1, wherein
the first insulation layer includes nitrogen (N).

7. The semiconductor memory device according to claim 1, wherein
the first insulation layer includes a spin-on glass layer.

8. The semiconductor memory device according to claim 1, wherein
the semiconductor layer includes intersections with the plurality of conductive layers, the intersections functioning as memory cell transistors.

9. The semiconductor memory device according to claim 8, wherein
the plurality of conductive layers function as gates of the memory cell transistors and word lines coupled to the gates.

10. A semiconductor memory device comprising:
a substrate;
a plurality of conductive layers stacked on the substrate in a first direction;
a first insulation layer extending in the plurality of conductive layers in the first direction;
a second insulation layer extending in the plurality of conductive layers in the first direction, the first insulation layer arranged between the substrate and the second insulation layer;
a semiconductor layer arranged between the first insulation layer and the plurality of conductive layers and between the second insulation layer and the plurality of conductive layers; and
a third insulation layer arranged between the semiconductor layer and the plurality of conductive layers,
wherein the first insulation layer includes polysilazane, and the second insulation layer does not include polysilazane, and wherein a lower end of the second insulation layer is located higher than an upper end of a lowermost conductive layer of the plurality of conductive layers in the first direction;

wherein the third insulation layer functions as a charge storage layer, and includes a first portion extending in the first direction and a second portion bent in a direction parallel to the substrate at a position between the lowermost conductive layer of the plurality of conductive layers and the substrate.

11. The semiconductor memory device according to claim 10, wherein an upper end of the first insulation layer is located higher, in a direction away from the substrate, than the upper end of the lowermost conductive layer of the plurality of conductive layers.

12. The semiconductor memory device according to claim 10, wherein an upper end of the first insulation layer is located higher, in a direction away from the base layer, than the second portion of the third insulation layer.

13. The semiconductor memory device according to claim 10, wherein the second insulation layer includes an air gap.

14. The semiconductor memory device according to claim 10, wherein the second insulation layer includes an air gap, and a lower end of the air gap is located higher than the second portion of the third insulation layer.

15. The semiconductor memory device according to claim 10, wherein the first insulation layer includes nitrogen (N).

16. The semiconductor memory device according to claim 10, wherein the first insulation layer includes a spin-on glass layer.

17. The semiconductor memory device according to claim 10, wherein the semiconductor layer includes intersections with the plurality of conductive layers, the intersections functioning as memory cell transistors.

18. The semiconductor memory device according to claim 17, wherein the plurality of conductive layers function as gates of the memory cell transistors and word lines coupled to the gates.

* * * * *